United States Patent
Bajwa

(10) Patent No.: US 10,861,820 B2
(45) Date of Patent: Dec. 8, 2020

(54) METHODS OF BONDING SEMICONDUCTOR ELEMENTS TO A SUBSTRATE, INCLUDING USE OF A REDUCING GAS, AND RELATED BONDING MACHINES

(71) Applicant: Kulicke and Soffa Industries, Inc., Fort Washington, PA (US)

(72) Inventor: Adeel Ahmad Bajwa, Blue Bell, PA (US)

(73) Assignee: KULICKE AND SOFFA INDUSTRIES, INC., Fort Washington, PA (US)

(*) Notice: Subject to any disclaimer, the term of this patent is extended or adjusted under 35 U.S.C. 154(b) by 0 days.

(21) Appl. No.: 16/272,166

(22) Filed: Feb. 11, 2019

(65) Prior Publication Data
US 2019/0252349 A1 Aug. 15, 2019

Related U.S. Application Data

(60) Provisional application No. 62/630,619, filed on Feb. 14, 2018, provisional application No. 62/790,200, filed on Jan. 9, 2019.

(51) Int. Cl.
*H01L 21/50* (2006.01)
*H01L 23/00* (2006.01)
(Continued)

(52) U.S. Cl.
CPC .............. *H01L 24/89* (2013.01); *H01L 21/50* (2013.01); *H01L 21/67017* (2013.01); *H01L 21/67103* (2013.01); *H01L 2021/603* (2013.01)

(58) Field of Classification Search
None
See application file for complete search history.

(56) References Cited

U.S. PATENT DOCUMENTS 7,332,424 B2   2/2008  Bélanger et al.
9,282,650 B2   3/2016  Dhavaleswarapu et al.
(Continued)

FOREIGN PATENT DOCUMENTS

WO   WO2012166911 A2   12/2012

OTHER PUBLICATIONS

International Search Report dated May 31, 2019 for International Patent Application No. PCT/US2019/017455.

*Primary Examiner* — Asok K Sarkar
(74) *Attorney, Agent, or Firm* — Christopher M. Spletzer, Sr.

(57) ABSTRACT

A method of bonding a semiconductor element to a substrate includes: carrying a semiconductor element including a plurality of first electrically conductive structures with a bonding tool; supporting a substrate including a plurality of second electrically conductive structures with a support structure; providing a reducing gas in contact with each of the plurality of first conductive structures and the plurality of second conductive structures; establishing contact between corresponding ones of the plurality of first conductive structures and the plurality of second conductive structures; moving at least one of the semiconductor element and the substrate such that the corresponding ones of the plurality of first conductive structures and the plurality of second conductive structures are separated; re-establishing contact between the plurality of first conductive structures and the plurality of second conductive structures; and bonding the plurality of first conductive structures to the respective ones of the plurality of second conductive structures.

24 Claims, 22 Drawing Sheets

(51) Int. Cl.
*H01L 21/67* (2006.01)
*H01L 21/603* (2006.01)

(56) References Cited

U.S. PATENT DOCUMENTS

| | | |
|---|---|---|
| 9,418,961 B2 | 8/2016 | Yu et al. |
| 2008/0188070 A1 | 8/2008 | Johnson et al. |
| 2009/0313816 A1 | 12/2009 | Cavazza |
| 2010/0084438 A1 | 4/2010 | Biggs et al. |
| 2010/0089978 A1 | 4/2010 | Hughlett et al. |
| 2012/0104076 A1 | 5/2012 | Suga et al. |
| 2017/0271145 A1 | 9/2017 | Dietze et al. |

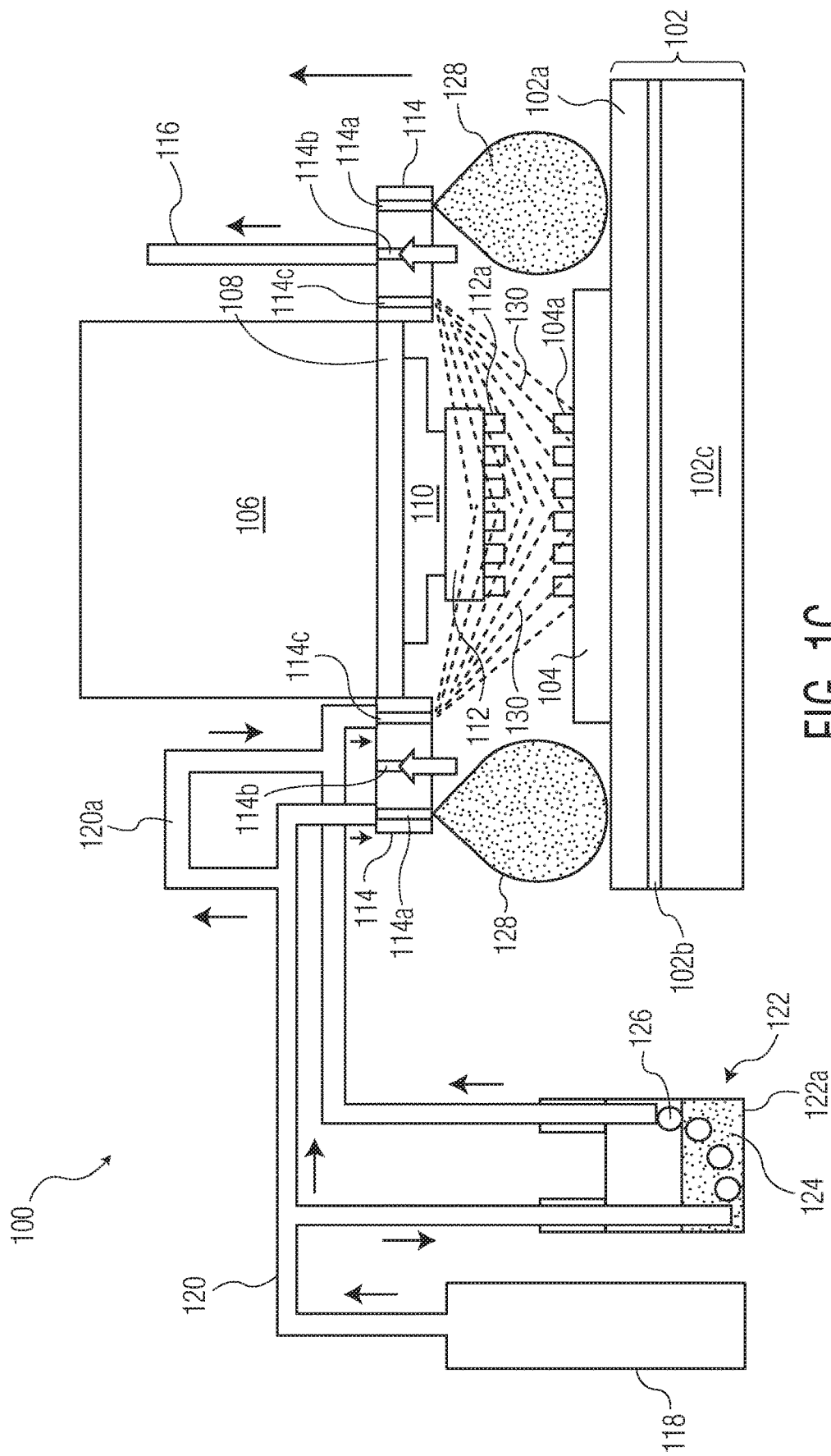

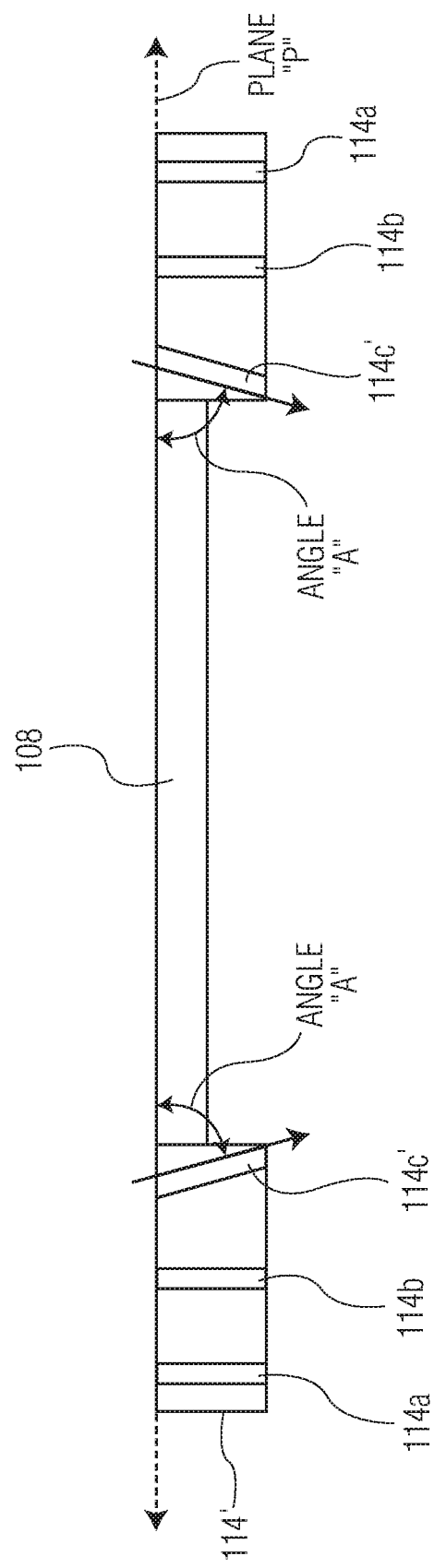

METHODS OF BONDING SEMICONDUCTOR ELEMENTS TO A SUBSTRATE, INCLUDING USE OF A REDUCING GAS, AND RELATED BONDING MACHINES

CROSS-REFERENCE TO RELATED APPLICATIONS

This application claims the benefit of U.S. Provisional Application No. 62/630,619, filed Feb. 14, 2018, and of U.S. Provisional Application No. 62/790,200, filed Jan. 9, 2019, the contents of both of which are incorporated herein by reference.

FIELD

The invention relates to bonding processes (such as flip chip and/or thermocompression bonding processes) and bonding machines (such as flip chip and/or thermocompression bonding systems), and more particularly, to improved methods of bonding a semiconductor element to a substrate including the use of a reducing gas.

BACKGROUND

Traditional semiconductor packaging typically involves die attach processes and wire bonding processes. Advanced semiconductor packaging technologies (e.g., flip chip bonding, thermocompression bonding, etc.) technologies continue to gain traction in the industry. For example, in thermocompression bonding (i.e., TCB), heat and/or pressure (and sometimes ultrasonic energy) are used to form a plurality of interconnections between (i) electrically conductive structures on a semiconductor element and (ii) electrically conductive structures on a substrate.

In certain flip chip bonding or thermocompression bonding applications, the electrically conductive structures of the semiconductor element and/or the substrate may include copper structures (e.g., copper pillars) or other material(s) that is subject to oxidation and/or other contamination. In such applications, it is desirable to provide an environment suitable for bonding. Conventionally, such an environment may be provided by using a reducing gas at the bonding area to reduce potential oxidation and/or contamination of the electrically conductive structures of the semiconductor element or the substrate to which it will be bonded.

Thus, it would be desirable to provide improved methods of bonding semiconductor elements to a substrate with the use of a reducing gas.

SUMMARY

According to an exemplary embodiment of the invention, a method of bonding a semiconductor element to a substrate is provided. The method includes the steps of: (a) carrying a semiconductor element with a bonding tool of a bonding machine, the semiconductor element including a plurality of first electrically conductive structures; (b) supporting a substrate with a support structure of the bonding machine, the substrate including a plurality of second electrically conductive structures; (c) providing a reducing gas in contact with each of the plurality of first electrically conductive structures and the plurality of second electrically conductive structures; (d) establishing contact between corresponding ones of the plurality of first electrically conductive structures and the plurality of second electrically conductive structures after step (c); (e) moving at least one of the semiconductor element and the substrate after step (d) such that the corresponding ones of the plurality of first electrically conductive structures and the plurality of second electrically conductive structures are separated from one another; (f) re-establishing contact between the corresponding ones of the plurality of first electrically conductive structures and the plurality of second electrically conductive structures after step (e); and (g) bonding the corresponding ones of the plurality of first electrically conductive structures to the respective ones of the plurality of second electrically conductive structures after step (f).

According to another exemplary embodiment of the invention, a bonding machine for bonding a semiconductor element to a substrate is provided. The bonding machine includes a bond head including a bonding tool, the bonding tool being configured to carry a semiconductor element, the semiconductor element including a plurality of first electrically conductive structures. The bonding machine also includes a support structure for supporting a substrate, the substrate including a plurality of second electrically conductive structures. The bonding machine also includes a manifold for directing a reducing gas to contact each of the plurality of first electrically conductive structures and the plurality of second electrically conductive structures. Prior to bonding of corresponding ones of the plurality of first electrically conductive structures to the respective ones of the plurality of second electrically conductive structures, the bonding machine is configured to (i) establish contact between the corresponding ones of the plurality of first electrically conductive structures and the plurality of second electrically conductive structures, (ii) move at least one of the semiconductor element and the substrate after step (i) such that the corresponding ones of the plurality of first electrically conductive structures and the plurality of second electrically conductive structures are separated from one another, and (iii) re-establish contact between the corresponding ones of the plurality of first electrically conductive structures and the plurality of second electrically conductive structures after step (ii). For example, such a bonding machine may be configured to perform steps (i), (ii), and (iii) by following computer program instructions included on a computer of the bonding machine (e.g., any one of bonding machines 100, 100', 100", and 100'" illustrated in the drawings and described herein).

According to yet another exemplary embodiment of the invention, a method of bonding a semiconductor element to a substrate is provided. The method includes the steps of: (a) carrying a semiconductor element with a bonding tool of a bonding machine, the semiconductor element including a plurality of first electrically conductive structures; (b) supporting a substrate with a support structure of the bonding machine, the substrate including a plurality of second electrically conductive structures; (c) providing a reducing gas in contact with each of the plurality of first electrically conductive structures and the plurality of second electrically conductive structures, the reducing gas being provided via a manifold for directing the reducing gas to contact each of the plurality of first electrically conductive structures and the plurality of second electrically conductive structures, the manifold including a fluid channel for carrying the reducing gas, the fluid channel being provided along an angle with respect to a horizontal plane of the bonding machine, the angle being between 10-60 degrees; and (d) bonding the corresponding ones of the plurality of first electrically conductive structures to the respective ones of the plurality of second electrically conductive structures after step (c).

According to yet another exemplary embodiment of the invention, a bonding machine for bonding a semiconductor element to a substrate is provided. The bonding machine includes a bond head including a bonding tool. The bonding tool is configured to carry a semiconductor element. The semiconductor element includes a plurality of first electrically conductive structures. The bonding machine also includes a support structure for supporting a substrate. The substrate includes a plurality of second electrically conductive structures. The bonding machine also includes a manifold for directing a reducing gas to contact each of the plurality of first electrically conductive structures and the plurality of second electrically conductive structures. The manifold includes a fluid channel for carrying the reducing gas, the fluid channel being provided along an angle with respect to a horizontal plane of the bonding machine, the angle being between 10-60 degrees.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 2B is detailed view of a portion of the bonding machine of FIG. 2A;

DETAILED DESCRIPTION

Figure 1A:
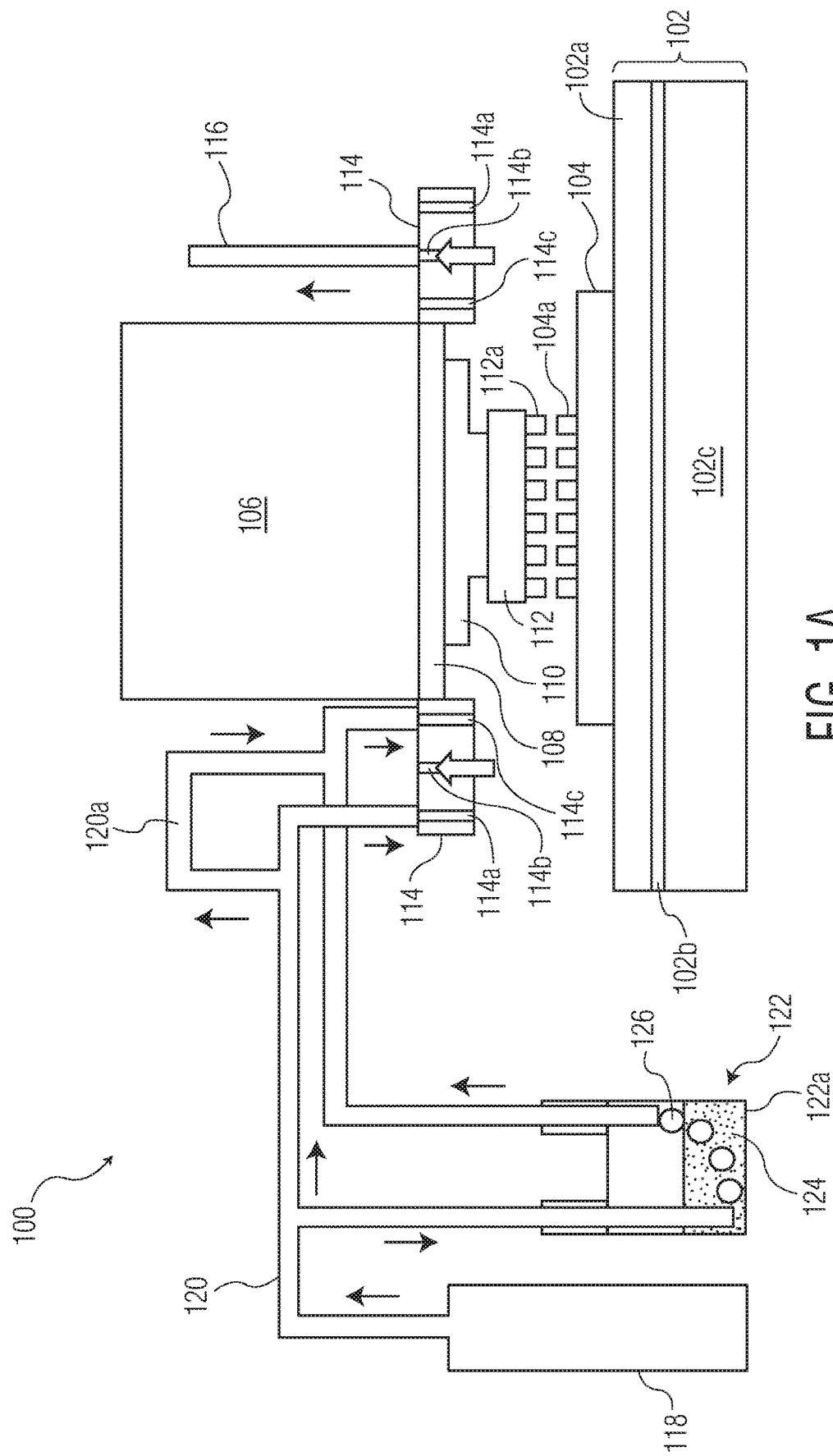
FIGS. 1A-1I are a series of block diagram illustrations of a bonding machine in accordance with an exemplary embodiment of the invention, also illustrating a method of bonding a semiconductor element to a substrate in accordance with an exemplary embodiment of the invention.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded. Exemplary substrates include, for example, a leadframe, a PCB, a carrier, a module, a semiconductor chip, a semiconductor wafer, a BGA substrate, another semiconductor element, etc.

Aspects of the invention may have particular applicability in connection with electrically conductive structures of a semiconductor element including copper, and when such electrically conductive structures are bonded (e.g., thermocompressively bonded) to electrically conductive structures of a substrate that also include copper, and further where the bonding occurs in the presence of a reducing gas. Using heat (e.g., from the heater of the bond head assembly) provided through the bonding tool, and the reducing gas, oxides and/or other contaminants on the surface of the electrically conductive structures (of the semiconductor element and/or the substrate) may be cleaned. Such a cleaning technique has been found to have particular applicability in copper to copper thermocompression bonding, where the electrically conductive structures on the semiconductor element (and/or the substrate) may be copper pillars, other copper structures, other conductive structures including copper, or the like.

In accordance with exemplary aspects of the invention, methods of bonding semiconductor elements are provided (in the presence of a reducing gas, such as a formic acid vapor) during which heat provided by a heater in the bond head assembly is transferred from (a) ones of electrically conductive structures of a semiconductor element to (b) respective ones of electrically conductive structures of the substrate to which the semiconductor element is being bonded. In particular, it is desirable that a portion of the electrically conductive structures of the substrate are adequately heated for cleaning—because surfaces of the electrically conductive structures of the substrate will be later used in connection with the bonding process.

In specific examples of such methods, a semiconductor element (e.g., a semiconductor chip) is transferred from a source (e.g., a semiconductor wafer) to a bonding tool of a thermocompression bonding machine or a flip chip bonding machine. With the semiconductor element carried by the bonding tool (e.g., using vacuum), the bond head assembly (carrying the bonding tool) is moved to a desired bonding position.

At the bonding position, contact is made between (i) ones of the electrically conductive structures of the semiconductor element and (ii) respective ones of the electrically conductive structures of the substrate. At this contact, force may be applied by the bonding tool (via the semiconductor element) in a range of, for example, 1-10 N, 5-10 N, among other ranges. An exemplary temperature range of the semiconductor element is between 300-400° C., while a corresponding exemplary temperature range at the interface of the electrically conductive structures of the semiconductor element after contact with the respective electrically conductive structures of the substrate is 200-250° C. Such an interface temperature may be adequate, depending on the application, for provoking the desired reaction for cleaning the electrically conductive structures of the substrate.

Localized heating provided to the electrically conductive structures of the semiconductor element (and the electrically conductive structures of the substrate), in the presence of the reducing gas (e.g., formic acid vapor) assists to clean the copper oxides on surfaces of the electrically conductive structures, especially at the interface region between the corresponding electrically conductive structures to be joined through the bonding process. The localized heating may be provided, at least in part, by contact between the corresponding electrically conductive structures to be joined. This contact step (which, as explained herein, includes separation of the corresponding electrically conductive structures after contact such as shown in FIG. 1E, explained below) may be repeated as desired, in connection with the reducing gas in the bonding area, until an acceptable amount of oxide and/or other contamination is removed. The duration of the contact step (or the separation between contact), and the number of contact repetitions, may be determined by application specific factors such as the thickness of the oxide (or other contaminants) on the electrically conductive structures on the substrate (and/or the electrically conductive structures of the semiconductor element). A key advantage of this method is the potential to avoid excessive heating of the substrate at a high temperature (e.g., substrate 104 may be at a temperature between 70° C.-100° C. during the method shown in FIGS. 1A-1I), especially for large substrate sizes (e.g., Ø=300 mm).

Other localized heating methods, such as laser assisted heating of a target area on the substrate (e.g., an interface region of the electrically conductive structures of the substrate), are contemplated. For example, such laser assisted heating may involve a raster scan fashion to target the entire bonding area.

Throughout the various drawings, like reference numerals refer to the like elements, except where explained herein.

Referring now to the drawings, FIG. 1A illustrates bonding machine 100 (e.g., a flip chip bonding machine, a thermocompression bonding machine, etc.). Bonding machine 100 includes a support structure 102 for supporting a substrate 104 during a bonding operation (where substrate 104 includes a plurality of electrically conductive structures 104a). Support structure 102 may include any appropriate structure for the specific application. In FIGS. 1A-1I, support structure 102 includes top plate 102a (configured to directly support substrate 104), chuck 102c, and heater 102b disposed therebetween. In applications where heat for heating substrate 104 is desirable in connection with the bonding operation, a heater such as heater 102b may be utilized.

FIG. 1A also illustrates bond head assembly 106, which may be configured to move along (and about) a plurality of axes of bonding machine 100 such as, for example, the x-axis, y-axis, z-axis, theta (rotative) axis, etc. Bond head assembly 106 includes heater 108 and bonding tool 110. That is, in certain bonding machines (e.g., thermocompression bonding machines) it may be desirable to heat the bonding tool. Thus, while FIG. 1A illustrates a separate heater 108 for heating bonding tool 110 (for heating semiconductor element 112 including a plurality of electrically conductive structures 112a), it will be appreciated that heater 108 and bonding tool 110 may be integrated into a single element (e.g., a heated bonding tool).

In connection with a bonding operation, semiconductor element 112 is bonded to substrate 104 using bonding tool 110. During the bonding operation, corresponding ones of electrically conductive structures 112a are bonded (e.g., using heat, force, ultrasonic energy, etc.) to respective ones of electrically conductive structures 104a.

In certain bonding applications (e.g., flip chip and/or thermocompression bonding with copper conductive structures), it is desirable to provide an environment suitable for bonding. Conventionally, such an environment may be provided by using a reducing gas at the bonding area to reduce potential contamination of the electrically conductive structures of the semiconductor element or the substrate to which it will be bonded.

In FIG. 1A, bond head assembly 106 carries a bond head manifold 114 for receiving and distributing fluids (e.g., gases, vapors, etc.) as desired in the given application. In FIG. 1A, while bond head manifold 114 is illustrated in a cross sectional view, the actual bond head manifold 114 surrounds bonding tool 110 (e.g., bond head manifold 114 surrounds bonding tool 110 in a coaxial configuration). Of course, bond head manifold 114 may have different configurations from that shown in FIG. 1A. Further, it is understood that certain details of bond head manifold 114 (e.g., interconnection with piping 120, structural details for distributing a reducing gas within bond head manifold 114, structural details for distributing a shielding gas within bond head manifold 114, structural details for drawing a vacuum through a center channel of bond head manifold 114, etc.) are omitted for simplicity.

Bond head manifold 114 includes three channels 114a, 114b, 114c having different functions. Outer channel 114a receives a shielding gas (e.g., nitrogen gas) from shielding gas supply 118. That is, a shielding gas is provided from shielding gas supply 118 (e.g., a nitrogen supply), through piping 120 (where piping 120 may include hard piping, flexible tubing, a combination of both, or any other structure adapted to carry the fluids described herein), to outer channel 114a of bond head manifold 114. From outer channel 114a of bond head manifold 114, the shielding gas 128 is provided as a shield from the outside environment (e.g., see FIG. 1C).

Inner channel 114c receives a reducing gas 130 (e.g., see FIG. 1C) (e.g., where the reducing gas is a saturated vapor gas) via piping 120, and provides reducing gas 130 in the area of semiconductor element 112 and substrate 104 in connection with a bonding operation. Reducing gas 130 is provided by a vapor generation system 122, but initiates as reducing gas 126. In the example shown in FIG. 1A, vapor generation system 122 is a bubbler type system including an acid fluid 124 (e.g., formic acid, acetic acid, etc.) in vessel 122a of the bubbler type system. A carrier gas (e.g., nitrogen) is provided (via piping 120) into acid fluid 124 in vessel 122a, where the carrier gas acts as a carrier for the acid fluid 124. Collectively, the carrier gas (e.g., nitrogen) and acid fluid 124 are transported as reducing gas 126. Within piping 120, additional carrier gas (e.g., nitrogen) may be added to reducing gas 126 (e.g., to vary the concentration of the reducing gas, as desired) via piping section 120a, thereby providing reducing gas 130 in the area of semiconductor element 112 and substrate 104 in connection with the bonding operation. After reducing gas 130 is distributed in the area of semiconductor element 112 and substrate 104, reducing gas 130 contacts surfaces of each of electrically conductive structures 104a and electrically conductive structures 112a. The surfaces of electrically conductive structures 104a/112a may then include a reaction product (e.g., where the reaction product is provided as a result of (i) a surface oxide on electrically conductive structures 104a/112a, (ii) reducing gas from reducing gas 130, and (iii) heat provided by heater 108 and transferred to electrically conductive structures 104a via contact with electrically conductive structures 112a that were already heated). This reaction product is desirably removed from the bonding area (i.e., the area where electrically conductive structures 112a of semiconductor element 112 are bonded to corresponding electrically conductive structures 104a of substrate 104) using vacuum provided through center channel 114b of bond head manifold 114 via exit piping 116.

Thus, FIG. 1A illustrates: (i) various elements of bonding machine 100; (ii) a path of carrier gas from carrier gas supply 118 to outer channel 114a of bond head manifold 114; (iii) a path of reducing gas 126 (which may receive additional carrier gas from piping 120) from vapor generation system 122 to inner channel 114c of bond head manifold 114, where it is released to the bonding area as reducing gas 130; and (iv) a path of gas (which may carry away a reaction product from surfaces of electrically conductive structures 104a/112a) drawn by vacuum through center channel 114b of bond head manifold 114. The aforementioned paths are illustrated in FIG. 1A through various arrows even though gas is not flowing in FIG. 1A.

Prior to the process shown and described in connection with FIGS. 1A-1I, semiconductor element 112 and/or substrate 104 may be "cleaned". For example, the electrically conductive structures 112a, 104a of one or both of semiconductor element 112 and substrate 104 may be cleaned using a solution such as hydrochloric acid or acetic acid. Such a cleaning step may be performed, for example, by dipping at least a portion of semiconductor element 112 and/or substrate 104 into such a solution.

Figure 1B:
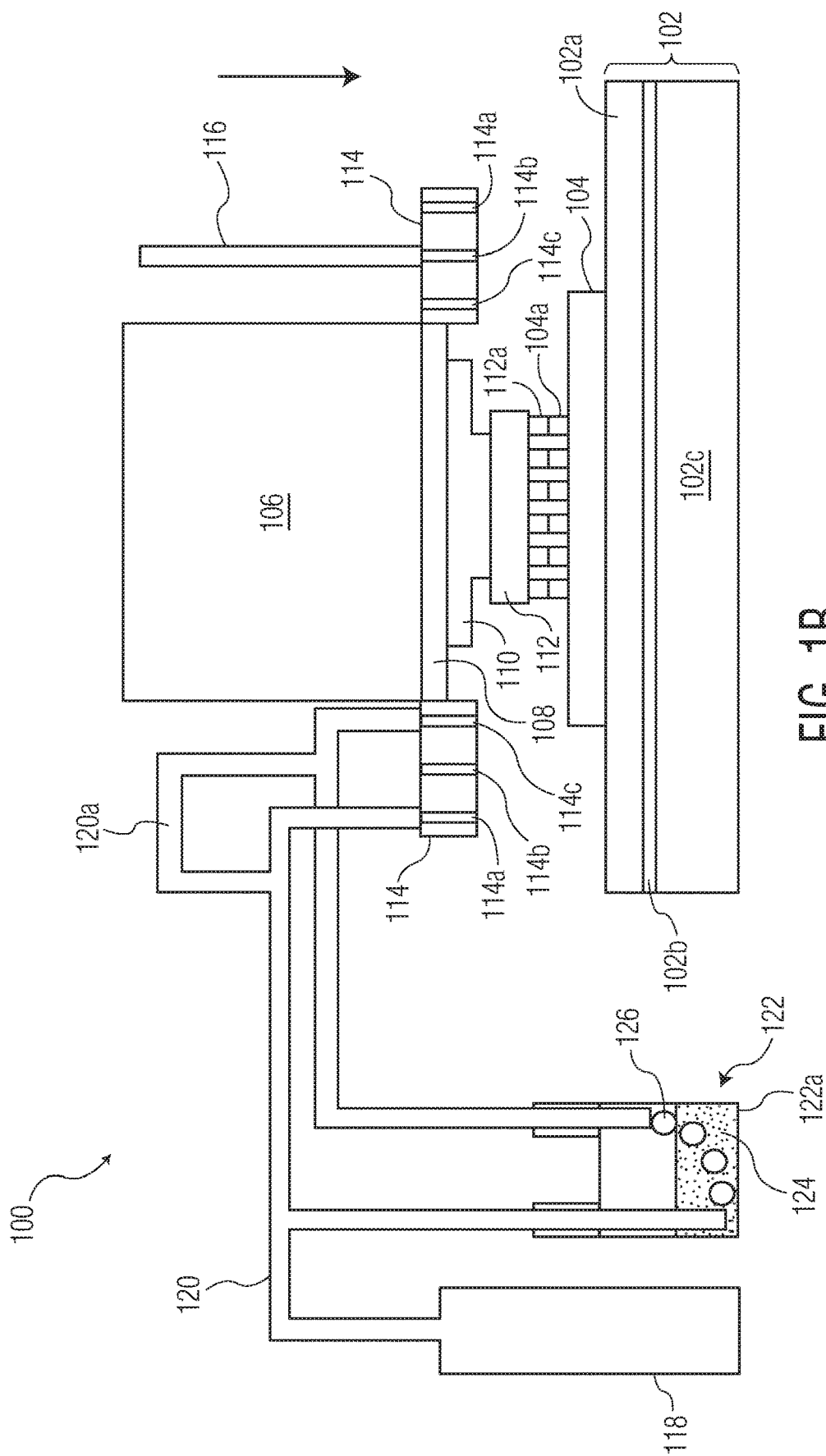

At FIG. 1B, bond head assembly 106 has been lowered from the position shown in FIG. 1A (as indicated by the downward arrow on the right hand side of the drawing) such that an initial touchdown is established between ones of electrically conductive structures 112a and respective ones of electrically conductive structures 104a. Such an initial touchdown may be useful for establishing a z-axis position (e.g., a height) of the initial contact between conductive structures 112a and corresponding conductive structures 104a for use during bonding. After the initial touchdown in FIG. 1B, vapor generation system 122 is activated to produce reducing gas 130 at the bonding area (e.g., see FIG. 1C).

FIG. 1C illustrates reducing gas 130 being provided at the bonding area, as well as shielding gas 128 being provided, and vacuum being drawn through center channel 114b of bond head manifold 114 via exit piping 116. At FIG. 1C, bond head assembly 106 has been raised (as indicated by the upward arrow on the right hand side of the drawing) (e.g., by a predetermined distance to allow the flow of reducing gas 130 to reach desired portions of semiconductor element 112 and substrate 104) such that the corresponding electrically conductive structures 104a and electrically conductive structures 112a are separated from one another. At FIG. 1C, heater 108 has heated semiconductor element 112 (and electrically conductive structures 112a) to a temperature (e.g., a temperature in the range of 300-400° C., a temperature in the range of 350-400° C., etc.). With reducing gas 130, and the heat provided to electrically conductive structures 112a by heater 108, electrically conductive structures 112a may be considered as "clean". That is, contaminants (e.g., a surface oxide) on the surface of electrically conductive structures 112a react with reducing gas 130 and heat to form a reaction product that is desirably removed from the bonding area using vacuum provided through center channel 114b of bond head manifold 114.

Figure 1D:
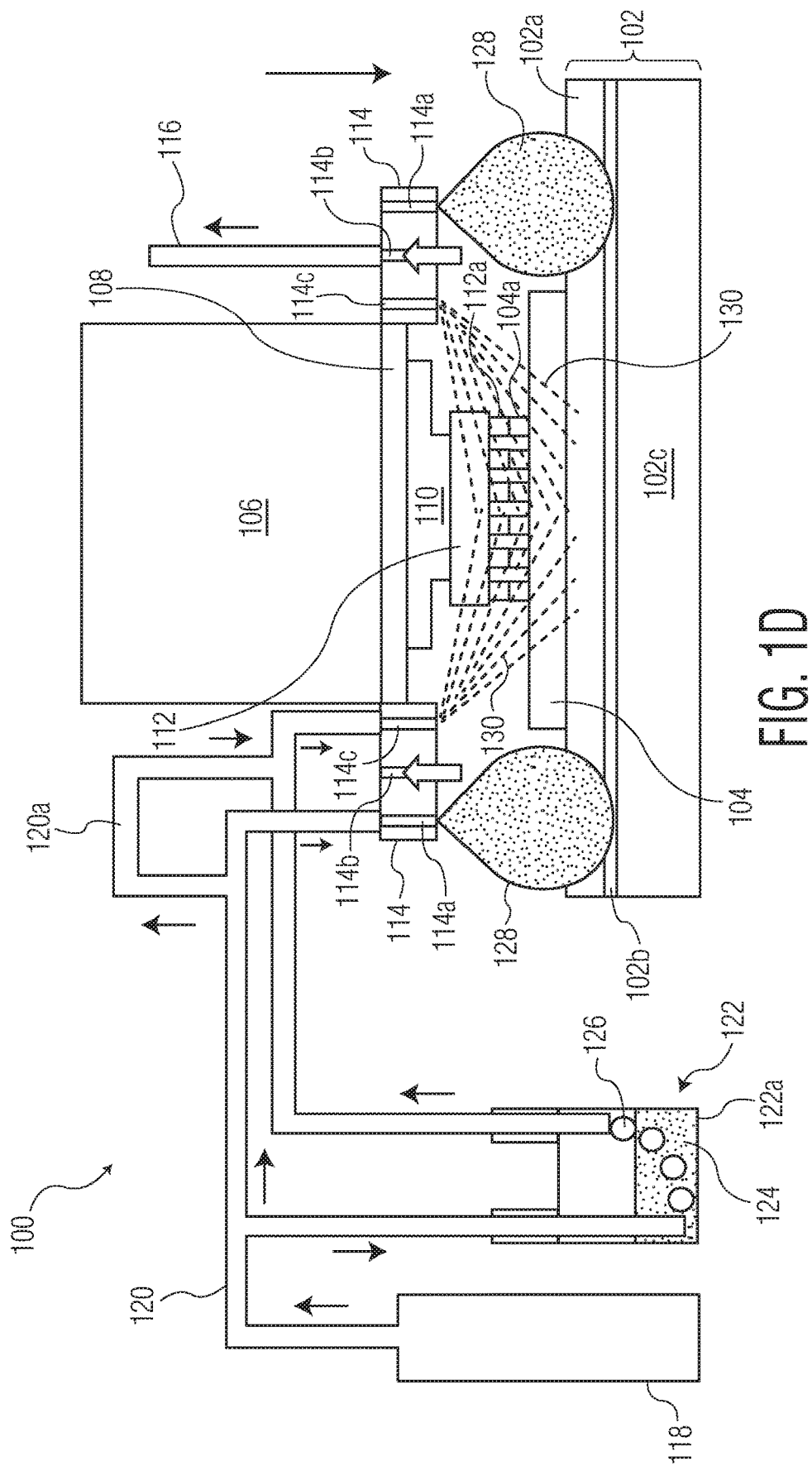
Figure 1E:
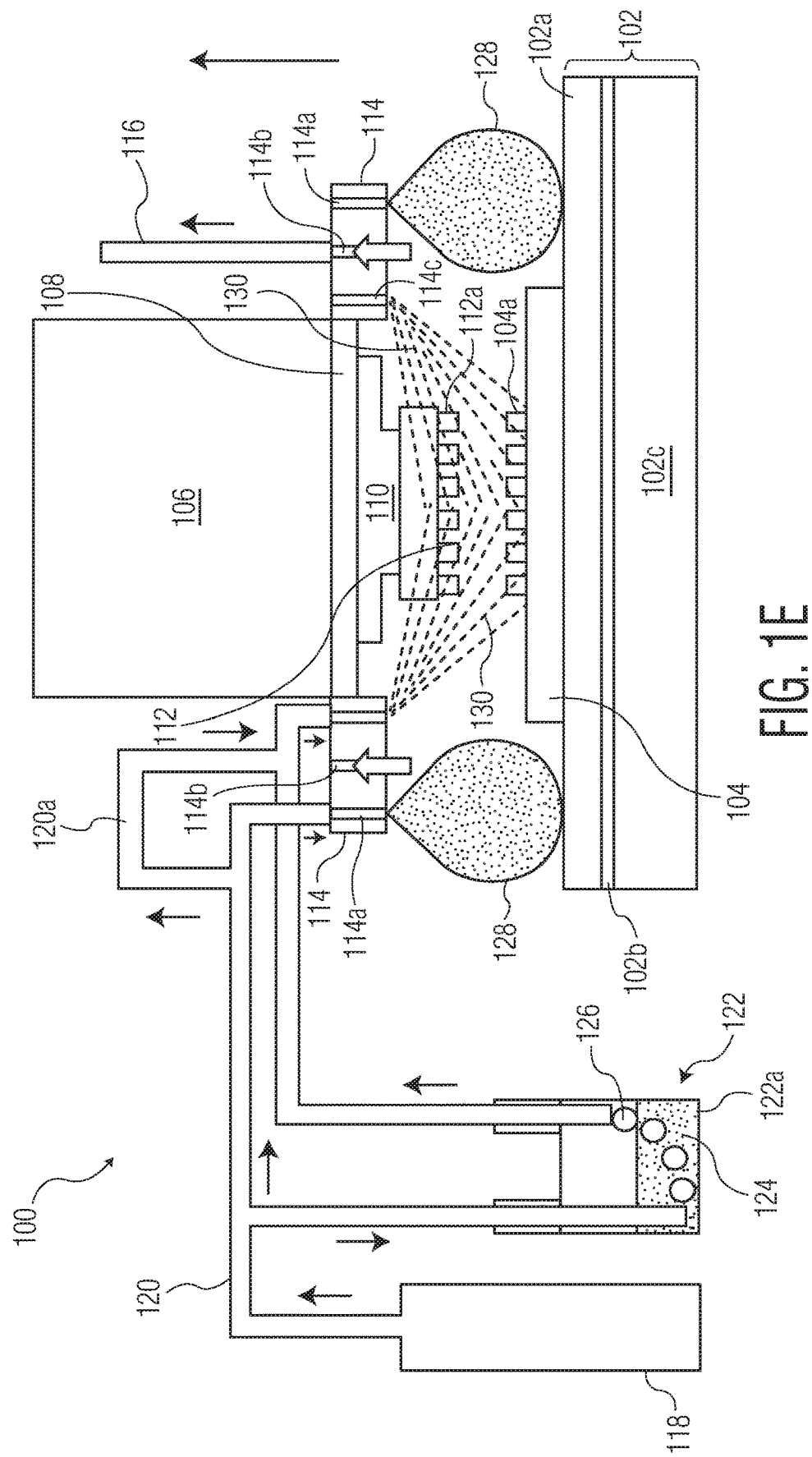

At FIG. 1D, bond head assembly 106 has been lowered to the same position as in FIG. 1B (as indicated by the downward arrow on the right hand side of the drawing) such that touchdown is re-established between ones of electrically conductive structures 104a and respective ones of electrically conductive structures 112a. A bond force (e.g., 1-10 N, 5-10 N, less than 10 N, etc.) may be applied by bond head assembly 106 carrying bonding tool 110. The contact between electrically conductive structures 104a and respective electrically conductive structures 112a at this step may be for any duration in order to provide the desired heat transfer. That is, heat transfer occurs at this step, because electrically conductive structures 112a have been heated by heater 108 (e.g., to a temperature between 300-400° C.), and heat transfers to electrically conductive structures 104a. This heat provided to electrically conductive structures 104a, in addition to reducing gas 130 adhering to surfaces of electrically conductive structures 104a, may react with contaminants (e.g., a surface oxide) on the surfaces of electrically conductive structures 104a, resulting in a reaction product desirably removed from the bonding area using vacuum provided through center channel 114b of bond head manifold 114. This cleaning may be continued through subsequent steps. Further, reducing gas 130 may continue to flow to prevent oxidation and/or other contamination on electrically conductive structures 112a/104a.

At FIG. 1E, bond head assembly 106 has been raised (as indicated by the upward arrow on the right hand side of the drawing) such that electrically conductive structures 104a and respective electrically conductive structures 112a are separated from one another. As reducing gas 130 continues to flow, the potential for further contamination may be substantially reduced, and cleaning may continue. This step may last any desired duration (e.g., 1-2 seconds), for example, such that there is adequate time to remove the reaction products (e.g., oxides and/or contamination) using the vacuum provided through center channel 114b of bond head manifold 114.

Figure 1F:
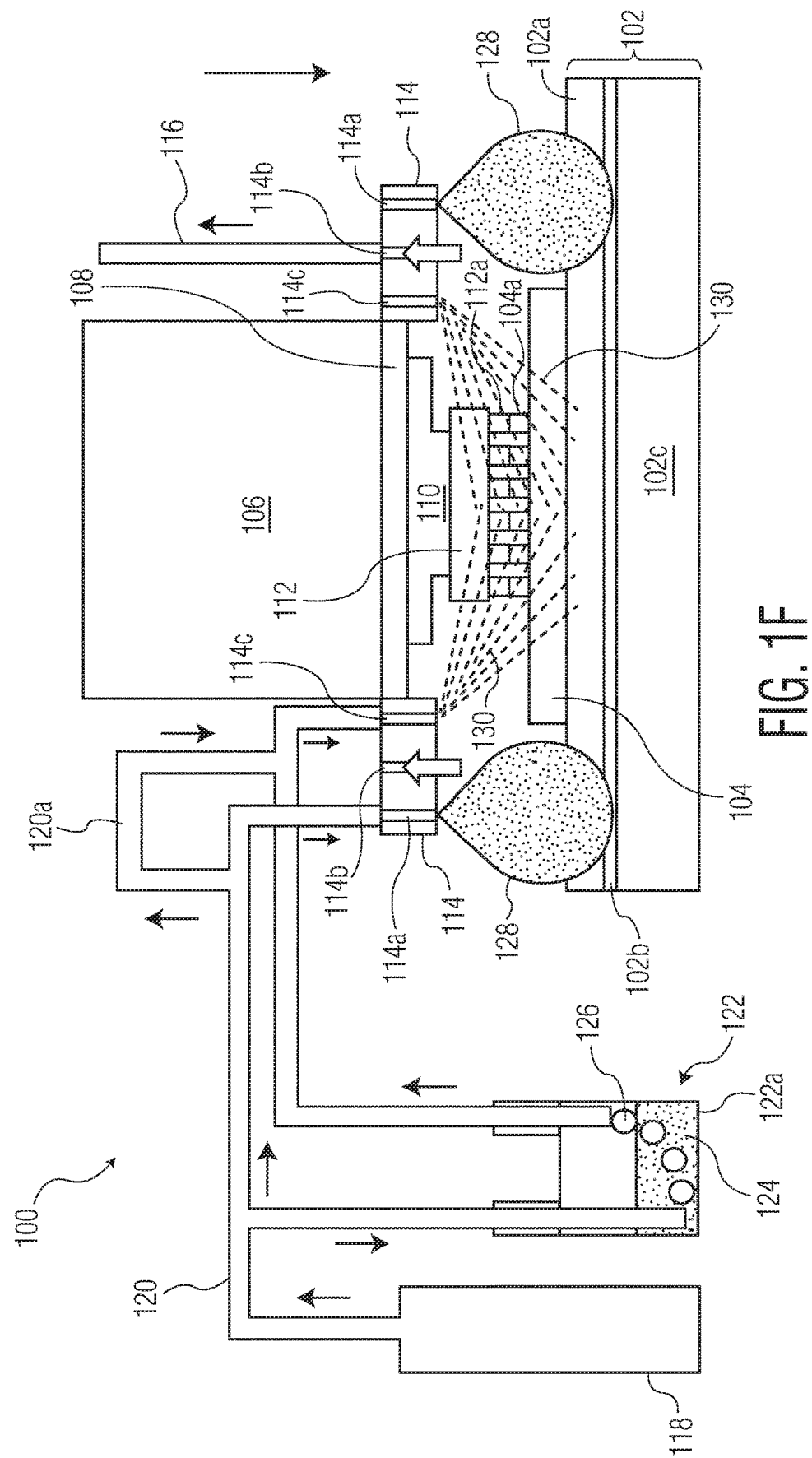
Figure 1G:
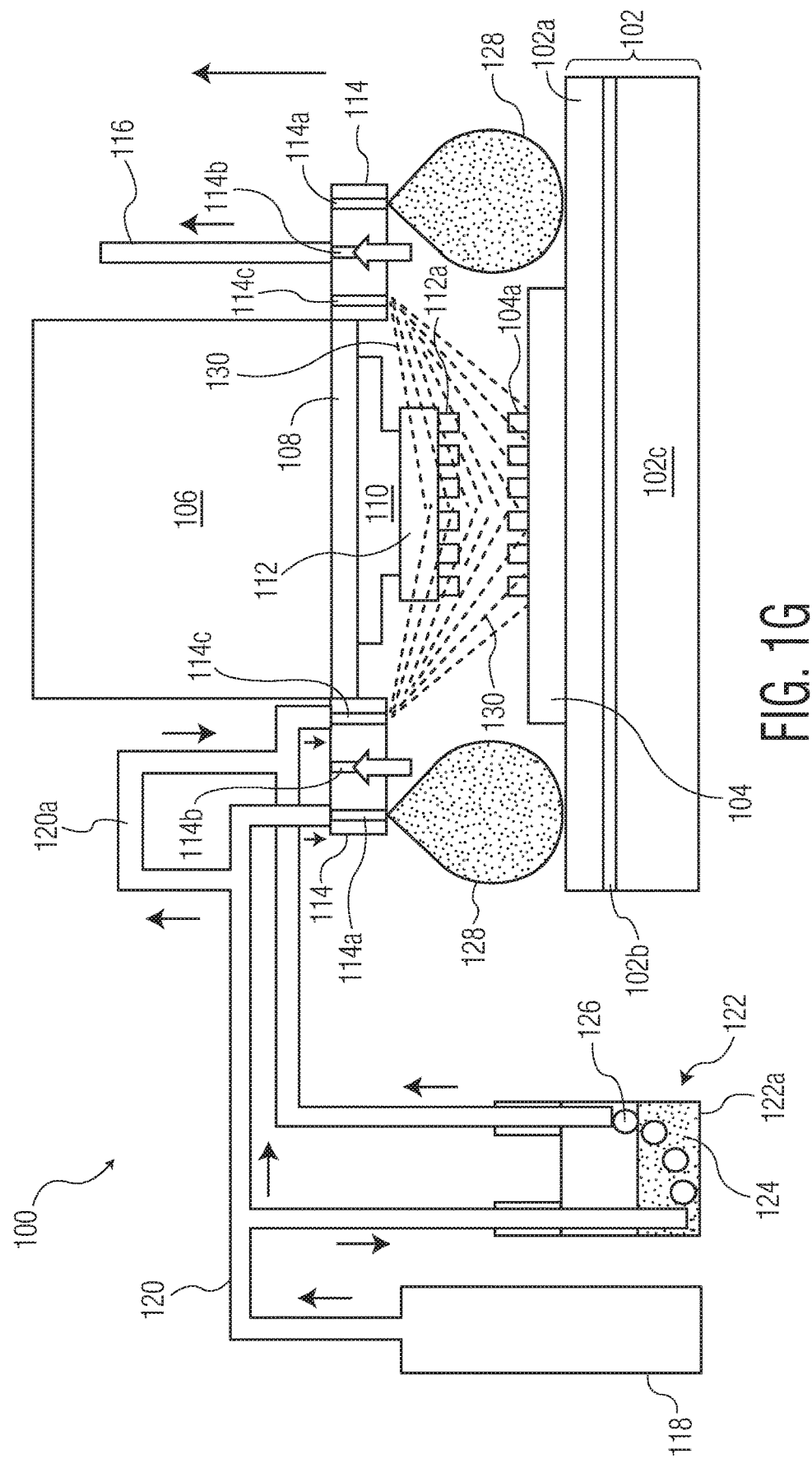
Figure 1H:
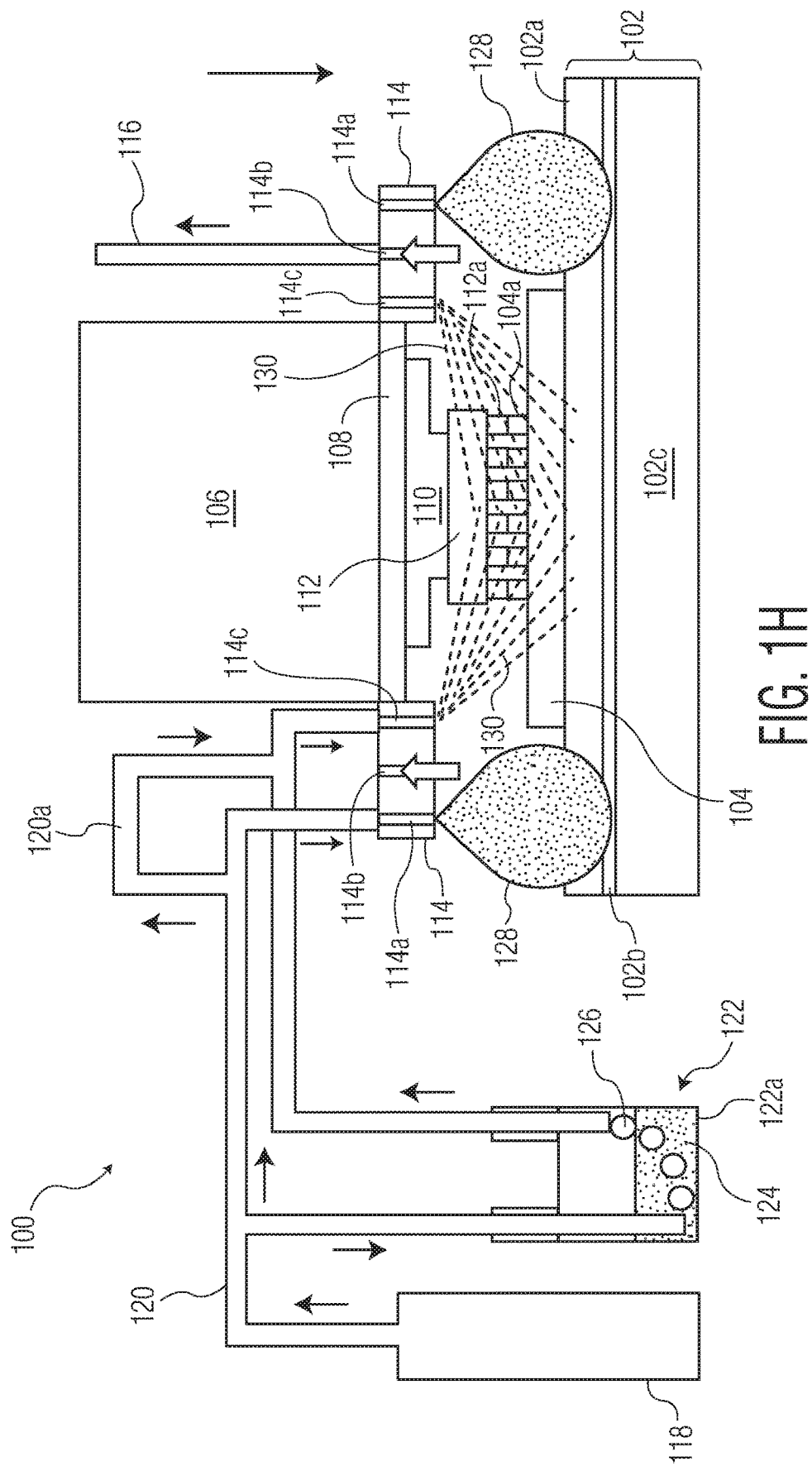
Figure 1T:
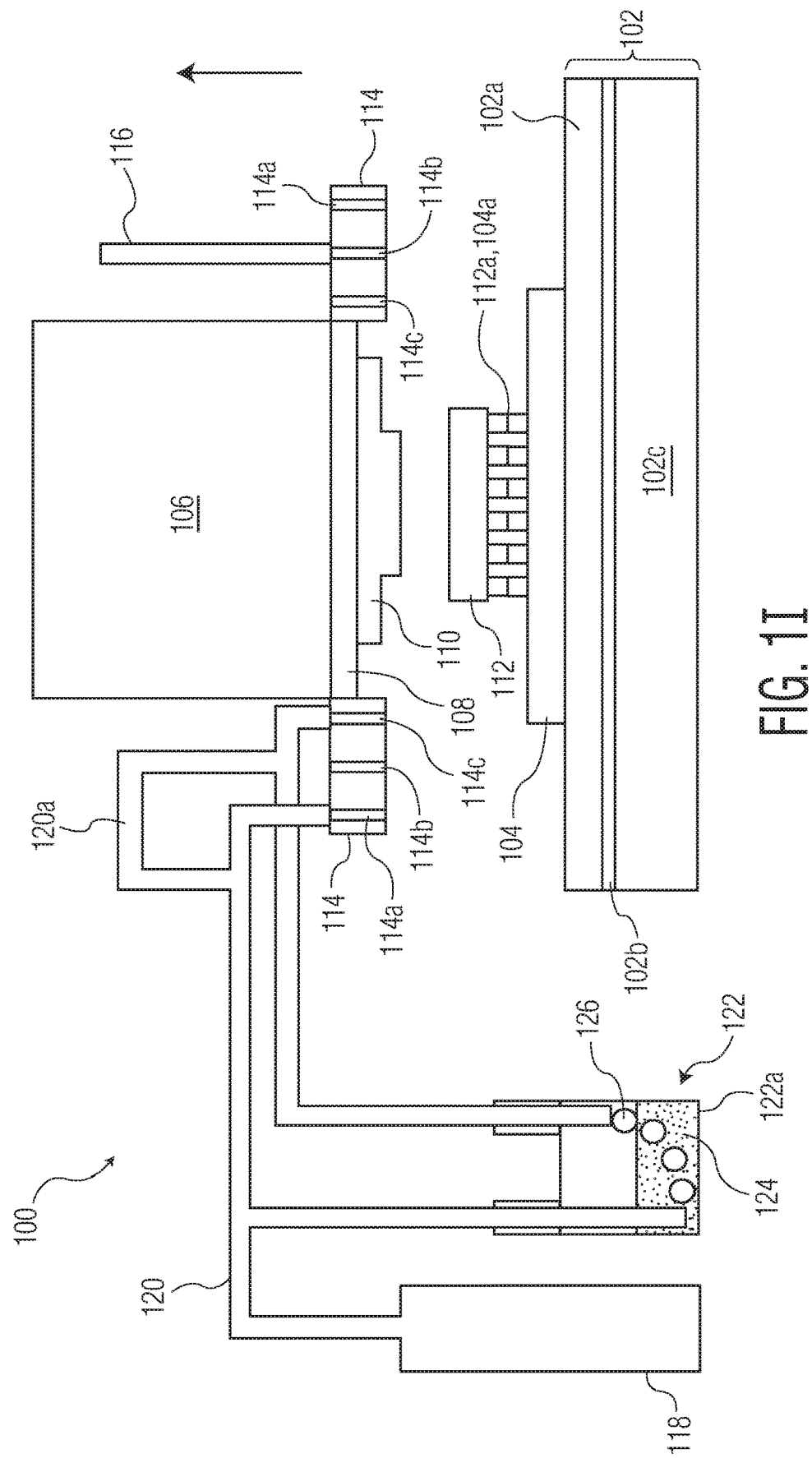

After FIG. 1E, the process may proceed to a bonding step (e.g., a thermocompression bonding step as shown in FIG. 1H); however, additional heat transfer (and associated cleaning) might be desired. Thus, FIGS. 1F-1G might be skipped, and the process may proceed from FIG. 1E to the bonding at FIG. 1H. However, the steps shown in FIGS. 1F-1G may occur, and in fact, may be repeated a number of times if desired to continue heat transfer and cleaning through the reaction of oxides/contaminants, reducing gas 130, and heat—with the reaction product desirably being removed by the vacuum in center channel 114b of bond head manifold 114.

At FIG. 1F, bond head assembly 106 has been lowered to the same position as in FIG. 1B and FIG. 1D (as indicated by the downward arrow on the right hand side of the drawing) such that touchdown is re-established to provide additional heat transfer from ones of electrically conductive structures 112a to respective ones of electrically conductive structures 104a.

At FIG. 1G, bond head assembly 106 has been raised (as indicated by the upward arrow on the right hand side of the drawing) such that the corresponding electrically conductive structures 104a and respective electrically conductive structures 112a are separated from one another. After the step shown at FIG. 1G, it may be determined that the cleaning process has been completed, and that the bonding process may now be completed; however, it is understood that the steps shown at FIGS. 1F-1G may be repeated, as desired.

At FIG. 1H, electrically conductive structures 112a are bonded to corresponding electrically conductive structures 104a. This may be through a thermocompression bonding process (e.g., including heat and/or bond force, where the bond force may be a higher bond force such as 50-300 N), and may also include ultrasonic energy transfer (e.g., from an ultrasonic transducer included in bond head assembly 106). At FIG. 1I, the bonding process has been completed. That is, semiconductor element 112 has been bonded to substrate 104, such that corresponding electrically conductive structures 112a, 104a are now bonded to one another.

Figure 2A:
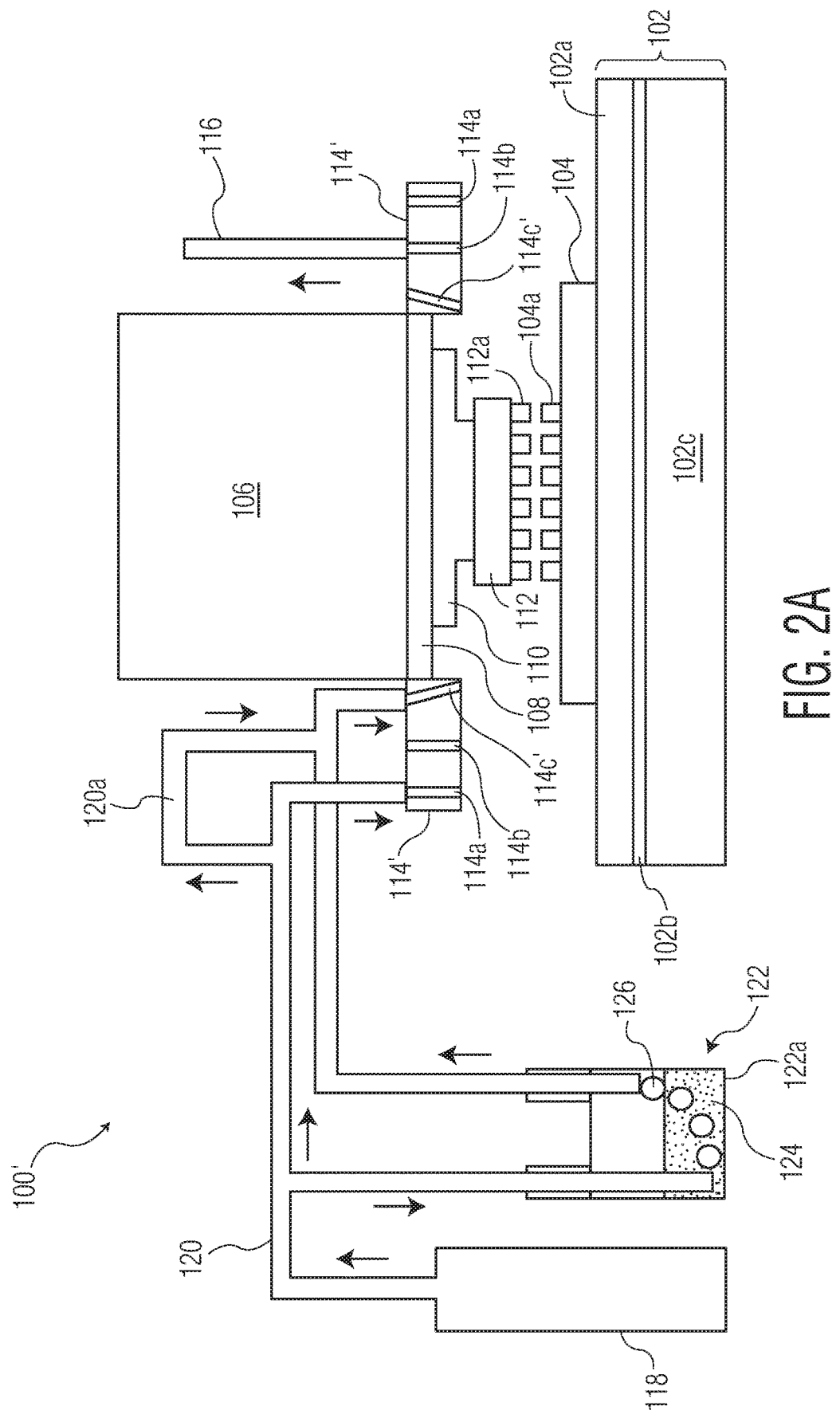
FIG. 2A is a block diagram illustration of another bonding machine in accordance with another exemplary embodiment of the invention.

FIGS. 2A-2B illustrate a bonding machine 100' that is substantially similar to bonding machine 100 (e.g., a flip chip bonding machine, a thermocompression bonding machine, etc.) illustrated and described above in connection with FIGS. 1A-1I. As such, for brevity, certain details regarding FIGS. 2A-2B are omitted from this description. Nonetheless, it is understood that the process of FIGS. 1A-1I may also be performed using bonding machine 100' of FIGS. 2A-2B. Bonding machine 100' of FIGS. 2A-2B differs from bonding machine 100 (of FIGS. 1A-1I) in connection with the inner channel of the bond head manifold. More specifically, in FIGS. 2A-2B, an inner channel 114c' of bond head manifold 114' is oriented along a non-vertical path. That is, inner channel 114c' is angled with respect to the illustrated horizontal plane "P" (see FIG. 2B). As will be appreciated by those skilled in the art, horizontal plane "P" may be oriented, for example, with respect to an x-axis and/or a y-axis of bonding machine 100'. An exemplary range for the angle "A" shown in FIG. 2B is between 10-60 degrees. By orienting inner channel 114c' along such an angle, the reducing gas (e.g., a saturated vapor gas) may be provided more efficiently to the area of semiconductor element 112 and substrate 104.

Although FIGS. 1A-1I illustrate manifold 114, integrated with the bond head, for: delivering the reducing gas; delivering the shielding gas; and providing vacuum—the invention is not limited thereto. For example, instead of such functions being provided through integration of a manifold with the bond head assembly, such functions may be provided through integration with a support structure for supporting the substrate. Further, such functions may be split between the bond head assembly and the support structure (and possibly other structures of the bonding machine). FIGS. 3A-3I are a series of block diagrams of a bonding machine 100", with certain similar elements and functions to that illustrated and described with respect to FIGS. 1A-1I, except that the manifold functions (delivering the reducing gas; delivering the shielding gas; and providing vacuum) are integrated into a support structure 202.

Figure 3A:
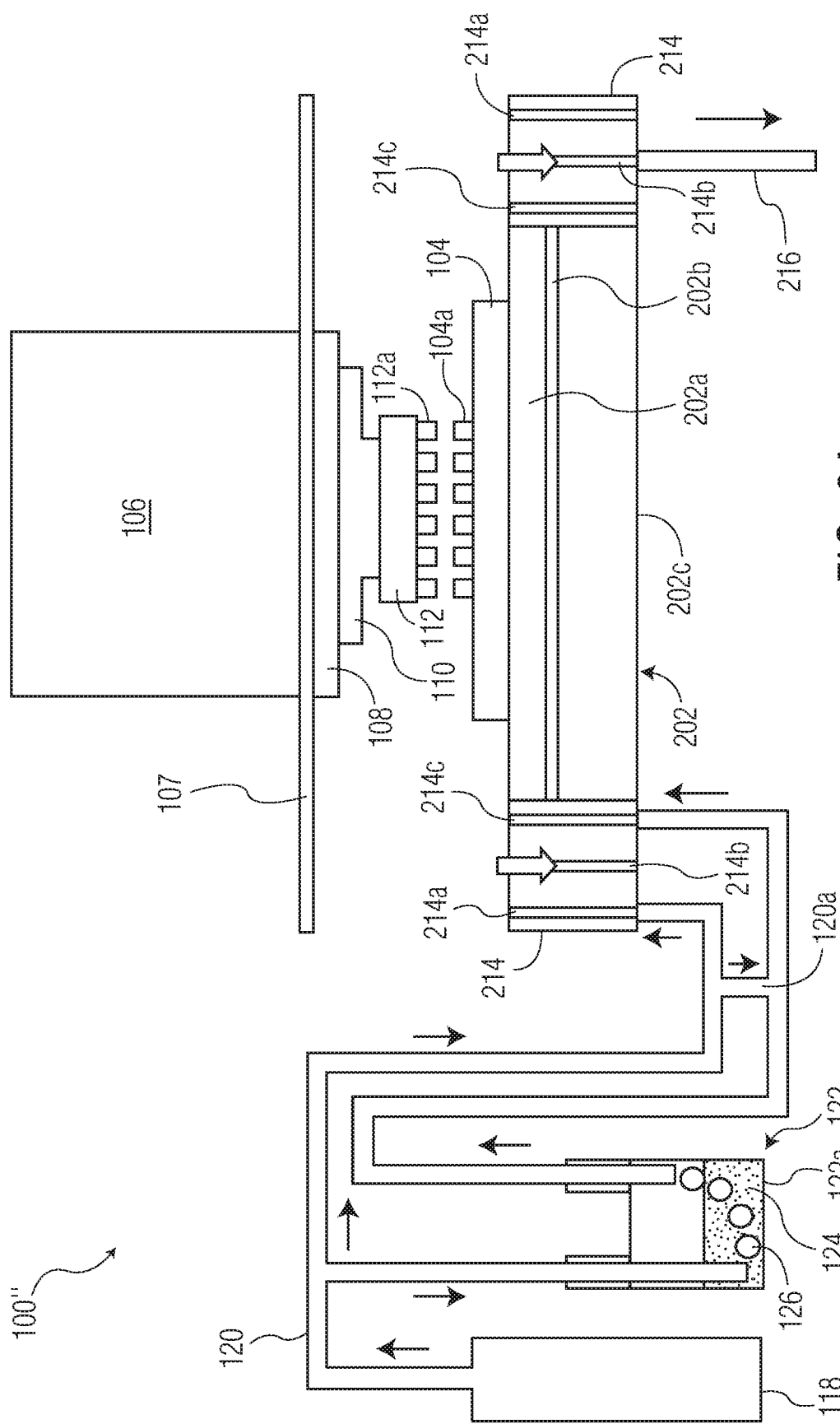
FIGS. 3A-3I are a series of block diagram illustrations of a bonding machine in accordance with another exemplary embodiment of the invention, also illustrating another method of bonding a semiconductor element to a substrate in accordance with an exemplary embodiment of the invention.

FIG. 3A illustrates bonding machine 100" (e.g., a flip chip bonding machine, a thermocompression bonding machine, etc.). Bonding machine 100" includes a support structure 202 for supporting a substrate 104 during a bonding operation (where substrate 104 includes a plurality of electrically conductive structures 104a). Support structure 202 may include any appropriate structure for the specific application. In FIGS. 3A-3I, support structure 202 includes top plate 202a (configured to directly support substrate 104), chuck 202c, and heater 202b disposed therebetween. In applications where heat for heating substrate 104 is desirable in connection with the bonding operation, a heater such as heater 202b may be utilized.

FIG. 3A also illustrates bond head assembly 106 (including heater 108 and bonding tool 110), which may be configured to move along (and about) a plurality of axes of bonding machine 100" such as, for example, the x-axis, y-axis, z-axis, theta (rotative) axis, etc. In FIG. 3A, bond head assembly 106 carries a plate 107 for partially containing at least one of shielding gas 128 and reducing gas 130 (see description below).

As opposed to a bond head manifold 114 carried by bond head assembly 106 (as in FIGS. 1A-1I), FIGS. 3A-3I illustrate a manifold 214 carried by, and/or intergrated with, support structure 202. Manifold 214 is configured for receiving and distributing fluids (e.g., gases, vapors, etc.) as desired in the given application. In FIG. 3A, while manifold 214 is illustrated in a cross sectional view, the actual manifold 214 at least partially surrounds substrate 104. Of course, manifold 214 may have different configurations from that shown in FIG. 3A. Further, it is understood that certain details of manifold 214 (e.g., interconnection with piping 120, structural details for distributing reducing gas 130 within manifold 214, structural details for distributing shielding gas 128 within manifold 214, structural details for drawing a vacuum through a center channel of manifold 214, etc.) are omitted for simplicity.

Manifold 214 includes three channels 214a, 214b, 214c having different functions. Outer channel 214a receives shielding gas 128 (e.g., nitrogen gas) from shielding gas supply 118 via piping 120. From outer channel 214a of manifold 214, shielding gas 128 is provided as a shield from the outside environment (e.g., see FIG. 3C). Inner channel 214c receives a reducing gas 130 (e.g., see FIG. 3C) (e.g., where the reducing gas is a saturated vapor gas) via piping 120, and provides reducing gas 130 in the area of semiconductor element 112 and substrate 104 in connection with a bonding operation. Reducing gas 130 is provided by a vapor generation system 122, but initiates as reducing gas 126 (e.g., see description above with respect to FIGS. 1A-1I). After reducing gas 130 is distributed in the area of semiconductor element 112 and substrate 104, reducing gas 130 contacts surfaces of each of electrically conductive structures 104a and electrically conductive structures 112a. The surfaces of electrically conductive structures 104a/112a may then include a reaction product (e.g., where the reaction product is provided as a result of (i) a surface oxide on electrically conductive structures 104a/112a, (ii) reducing gas from reducing gas 130, and (iii) heat provided by heater 108 and transferred to electrically conductive structures 104a via contact with electrically conductive structures 112a that were already heated). This reaction product is desirably removed from the bonding area (i.e., the area where electrically conductive structures 112a of semiconductor element 112 are bonded to corresponding electrically conductive structures 104a of substrate 104) using vacuum provided through center channel 214b of manifold 214 via exit piping 216.

Thus, FIG. 3A illustrates: (i) various elements of bonding machine 100"; (ii) a path of carrier gas from carrier gas supply 118 to outer channel 214a of manifold 214; (iii) a path of reducing gas 126 (which may receive additional carrier gas from piping 120a) from vapor generation system 122 to inner channel 214c of manifold 214, where it is released to the bonding area as reducing gas 130; and (iv) a path of gas (which may carry away a reaction product from surfaces of electrically conductive structures 104a/112a) drawn by vacuum through center channel 214b of manifold 214. The aforementioned paths are illustrated in FIG. 3A through various arrows even though gas is not flowing in FIG. 3A.

Prior to the process shown and described in connection with FIGS. 3A-3I, semiconductor element 112 and/or substrate 104 may be "cleaned". For example, the electrically conductive structures 112a, 104a of one or both of semiconductor element 112 and substrate 104 may be cleaned using a solution such as hydrochloric acid or acetic acid. Such a cleaning step may be performed, for example, by dipping at least a portion of semiconductor element 112 and/or substrate 104 into such a solution.

Figure 3B:
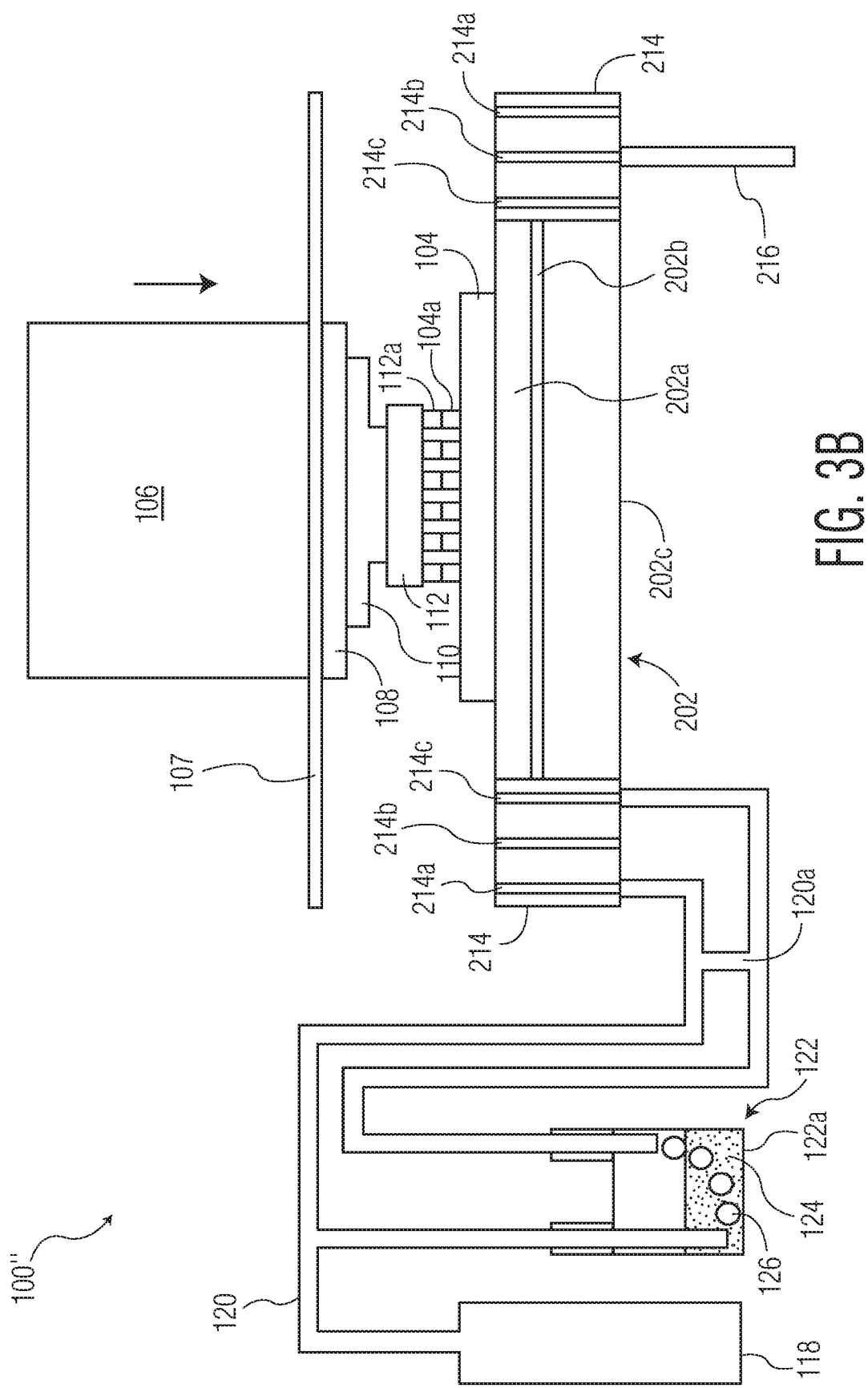

At FIG. 3B, bond head assembly 106 has been lowered from the position shown in FIG. 3A (as indicated by the downward arrow on the right hand side of the drawing) such that an initial touchdown is established between ones of electrically conductive structures 112a and respective ones of electrically conductive structures 104a. Such an initial touchdown may be useful for establishing a z-axis position (e.g., a height) of the initial contact between conductive structures 112a and corresponding conductive structures 104a for use during bonding. After the initial touchdown in FIG. 3B, vapor generation system 122 is activated to produce reducing gas 130 at the bonding area (e.g., see FIG. 3C).

Figure 3C:
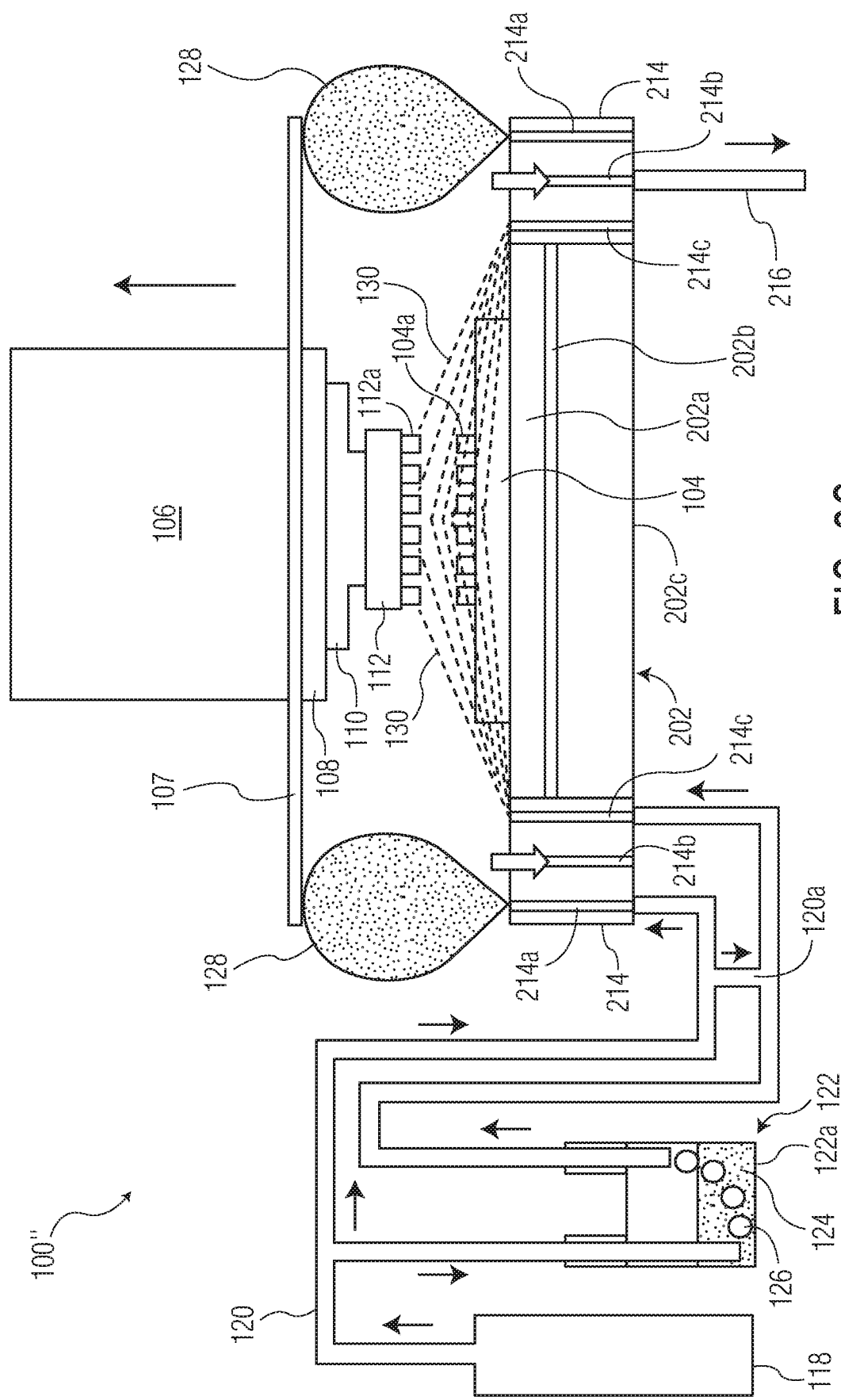

FIG. 3C illustrates reducing gas 130 being provided at the bonding area, as well as shielding gas 128 being provided, and vacuum being drawn through center channel 214b of manifold 214 via exit piping 216. Plate 107 acts as a partial barrier, to partially contain (and/or slow down the flow of) shielding gas 128 and/or reducing gas 130. At FIG. 3C, bond head assembly 106 has been raised (as indicated by the upward arrow on the right hand side of the drawing) (e.g., by a predetermined distance to allow the flow of reducing gas 130 to reach desired portions of semiconductor element 112 and substrate 104) such that the corresponding electrically conductive structures 104a and electrically conductive structures 112a are separated from one another. At FIG. 3C, heater 108 has heated semiconductor element 112 (and electrically conductive structures 112a) to a temperature (e.g., a temperature in the range of 300-400° C., a temperature in the range of 350-400° C., etc.). With reducing gas 130, and the heat provided to electrically conductive structures 112a by heater 108, electrically conductive structures 112a may be considered as "clean". That is, contaminants (e.g., a surface oxide) on the surface of electrically conductive structures 112a react with reducing gas 130 and heat to form a reaction product that is desirably removed from the bonding area using vacuum provided through center channel 214b of manifold 214.

Figure 3D:
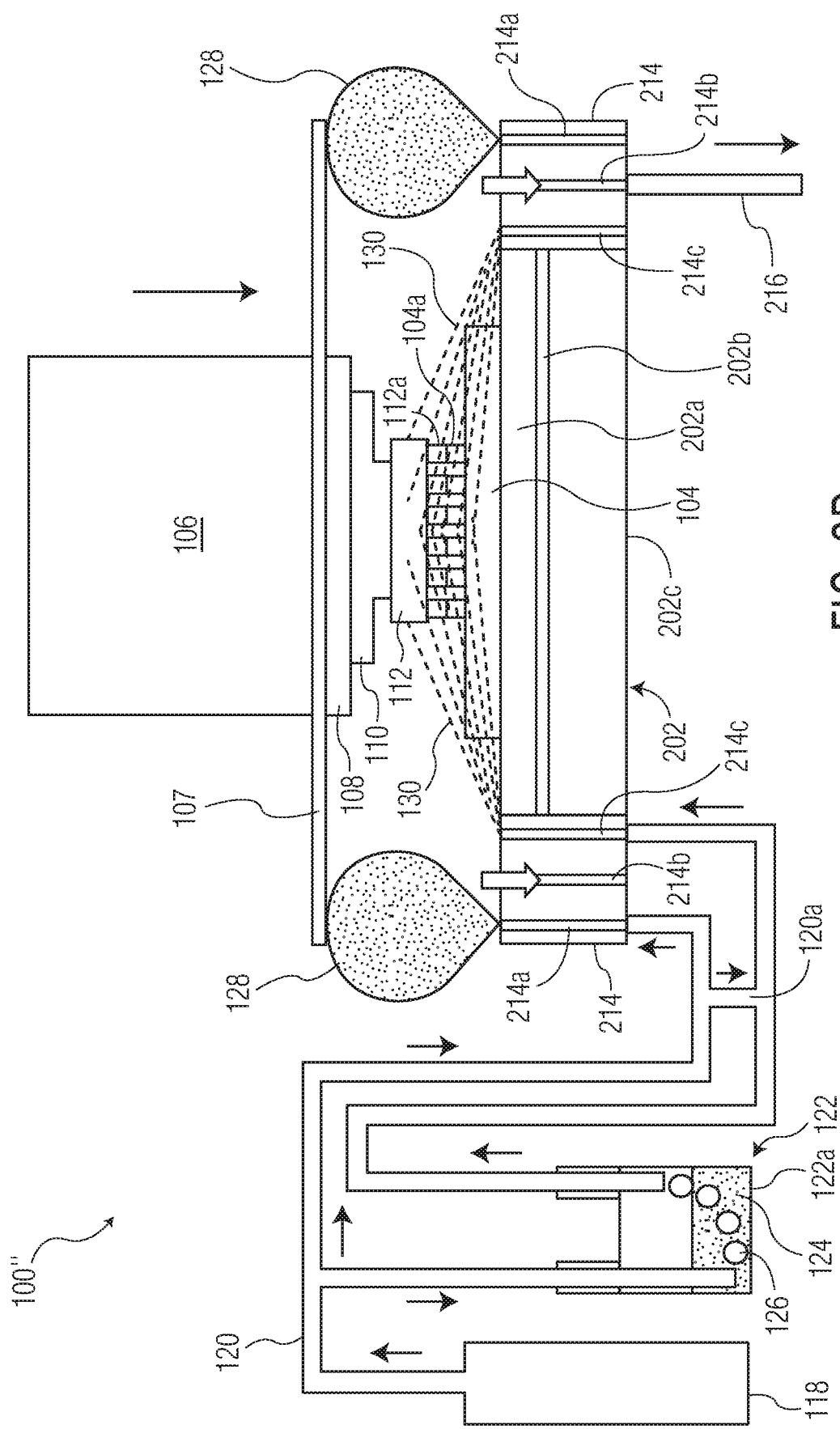

At FIG. 3D, bond head assembly 106 has been lowered to the same position as in FIG. 3B (as indicated by the downward arrow on the right hand side of the drawing) such that touchdown is re-established between ones of electrically conductive structures 104a and respective ones of electrically conductive structures 112a. A bond force (e.g., 1-10 N, 5-10 N, less than 10 N, etc.) may be applied by bond head assembly 106 carrying bonding tool 110. The contact between electrically conductive structures 104a and respective electrically conductive structures 112a at this step may be for any duration in order to provide the desired heat transfer. That is, heat transfer occurs at this step, because electrically conductive structures 112a have been heated by heater 108 (e.g., to a temperature between 300-400° C.), and heat transfers to respective electrically conductive structures 104a. This heat provided to electrically conductive structures 104a, in addition to reducing gas 130 adhering to surfaces of electrically conductive structures 104a, may react with contaminants (e.g., a surface oxide) on the surfaces of electrically conductive structures 104a, resulting in a reaction product desirably removed from the bonding area using vacuum provided through center channel 214b of manifold 214. This cleaning may be continued through subsequent steps. Further, reducing gas 130 may continue to flow to prevent oxidation and/or other contamination on electrically conductive structures 112a/104a.

Figure 3E:
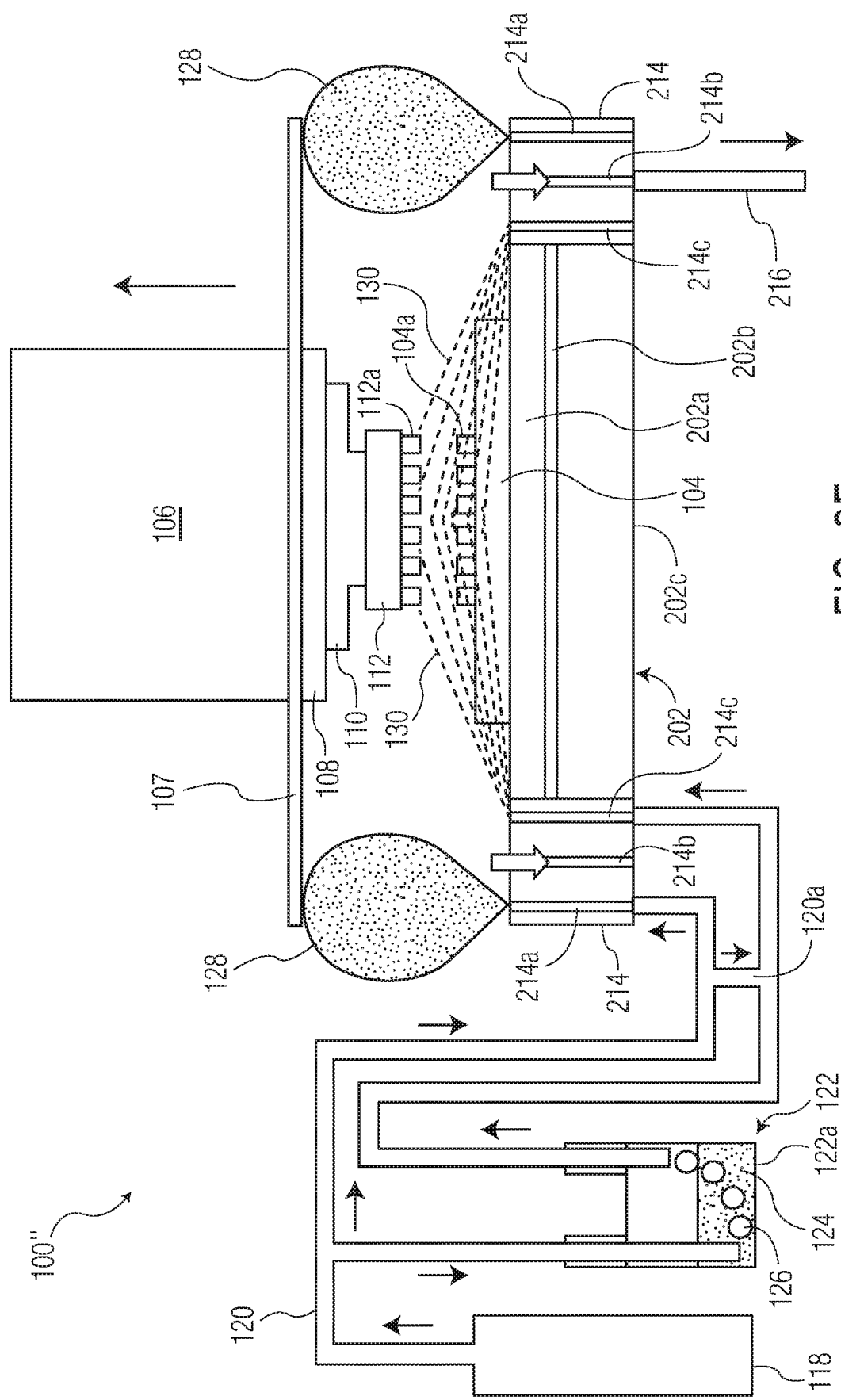

At FIG. 3E, bond head assembly 106 has been raised (as indicated by the upward arrow on the right hand side of the drawing) such that electrically conductive structures 104a and respective electrically conductive structures 112a are separated from one another. As reducing gas 130 continues to flow, the potential for further contamination may be substantially reduced, and cleaning may continue. This step may last any desired duration (e.g., 1-2 seconds), for example, such that there is adequate time to remove the reaction products (e.g., oxides and/or contamination) using the vacuum provided through center channel 214b of manifold 214.

Figure 3F:
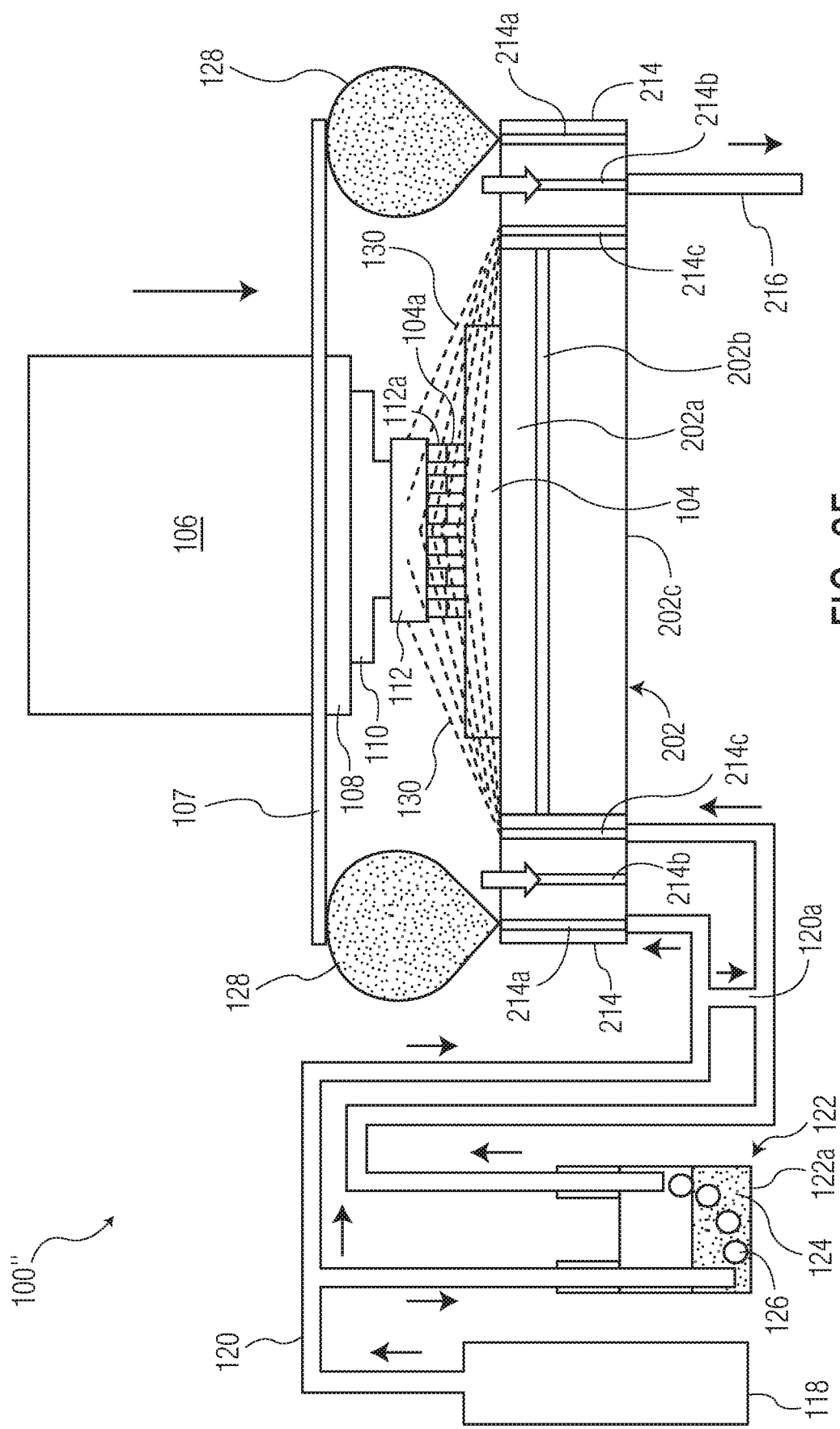
Figure 3G:
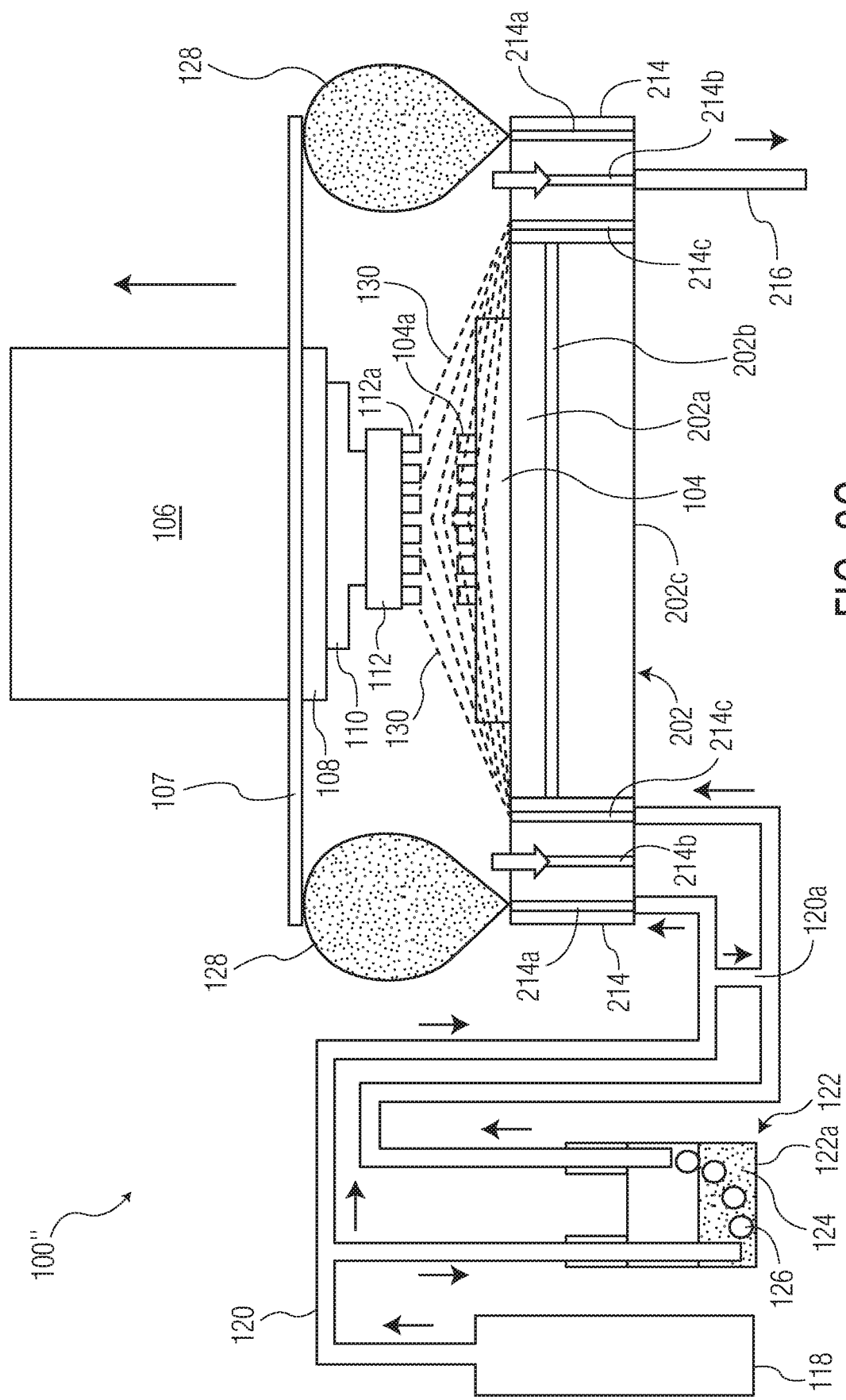
Figure 3H:
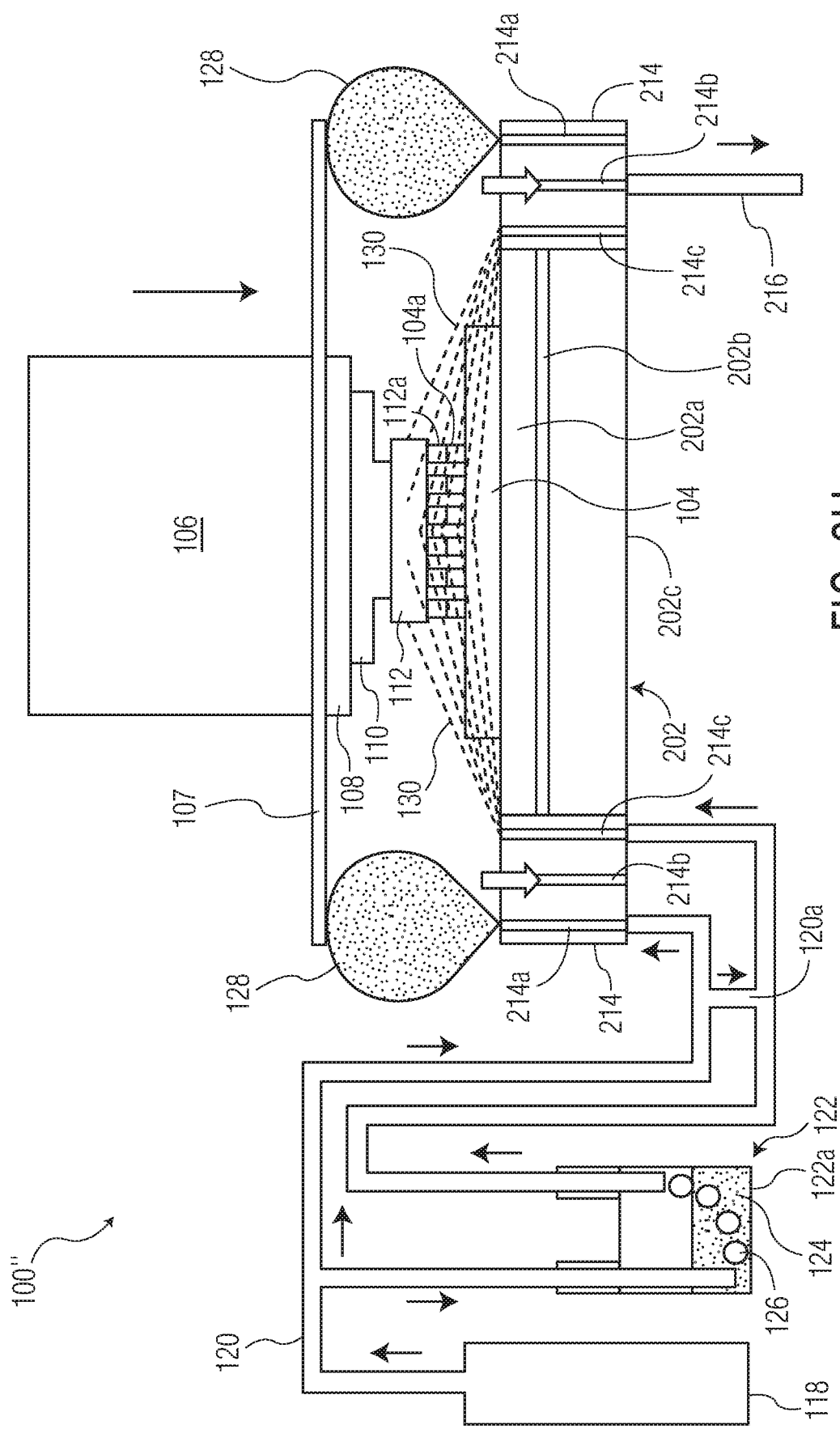
Figure 3I:
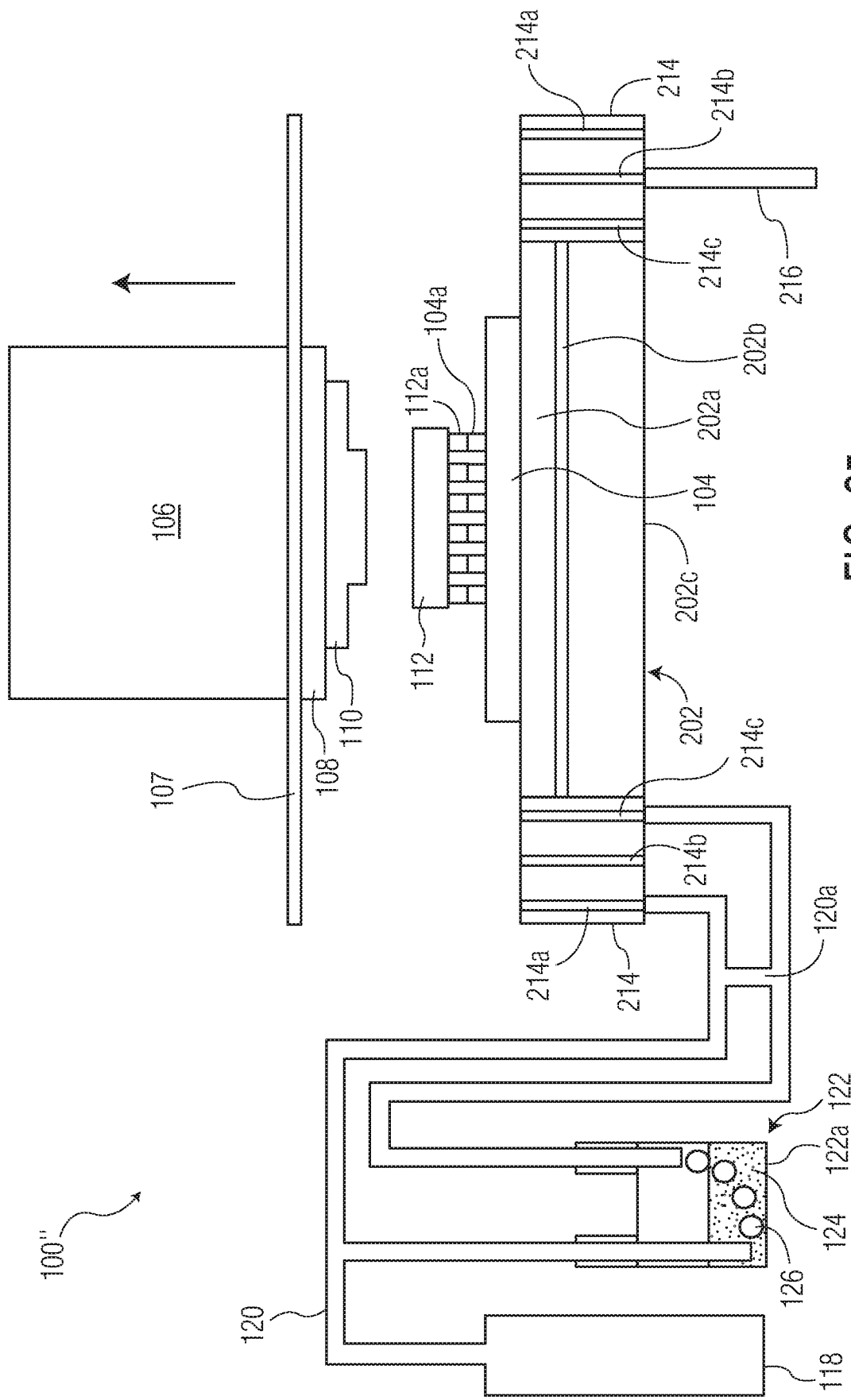

After FIG. 3E, the process may proceed to a bonding step (e.g., a thermocompression bonding step as shown in FIG. 3H); however, additional heat transfer (and associated cleaning) might be desired. Thus, FIGS. 3F-3G might be skipped, and the process may proceed from FIG. 3E to the bonding at FIG. 3H. However, the steps shown in FIGS. 3F-3G may occur, and in fact, may be repeated a number of times if desired to continue heat transfer and cleaning through the reaction of oxides/contaminants, reducing gas 130, and heat—with the reaction product desirably being removed by the vacuum in center channel 214b of manifold 214.

At FIG. 3F, bond head assembly 106 has been lowered to the same position as in FIG. 3B and FIG. 3D (as indicated by the downward arrow on the right hand side of the drawing) such that touchdown is re-established to provide additional heat transfer from ones of electrically conductive structures 112a to respective ones of electrically conductive structures 104a.

At FIG. 3G, bond head assembly 106 has been raised (as indicated by the upward arrow on the right hand side of the drawing) such that the corresponding electrically conductive structures 104a and respective electrically conductive structures 112a are separated from one another. After the step shown at FIG. 3G, it may be determined that the cleaning process has been completed, and that the bonding process may now be completed; however, it is understood that the steps shown at FIGS. 3F-3G may be repeated, as desired.

At FIG. 3H, electrically conductive structures 112a are bonded to corresponding electrically conductive structures 104a. This may be through a thermocompression bonding process (e.g., including heat and/or bond force, where the bond force may be a higher bond force such as 50-300 N), and may also include ultrasonic energy transfer (e.g., from an ultrasonic transducer included in bond head assembly 106). At FIG. 3I, the bonding process has been completed. That is, semiconductor element 112 has been bonded to substrate 104, such that corresponding electrically conductive structures 112a, 104a are now bonded to one another.

Figure 4A:
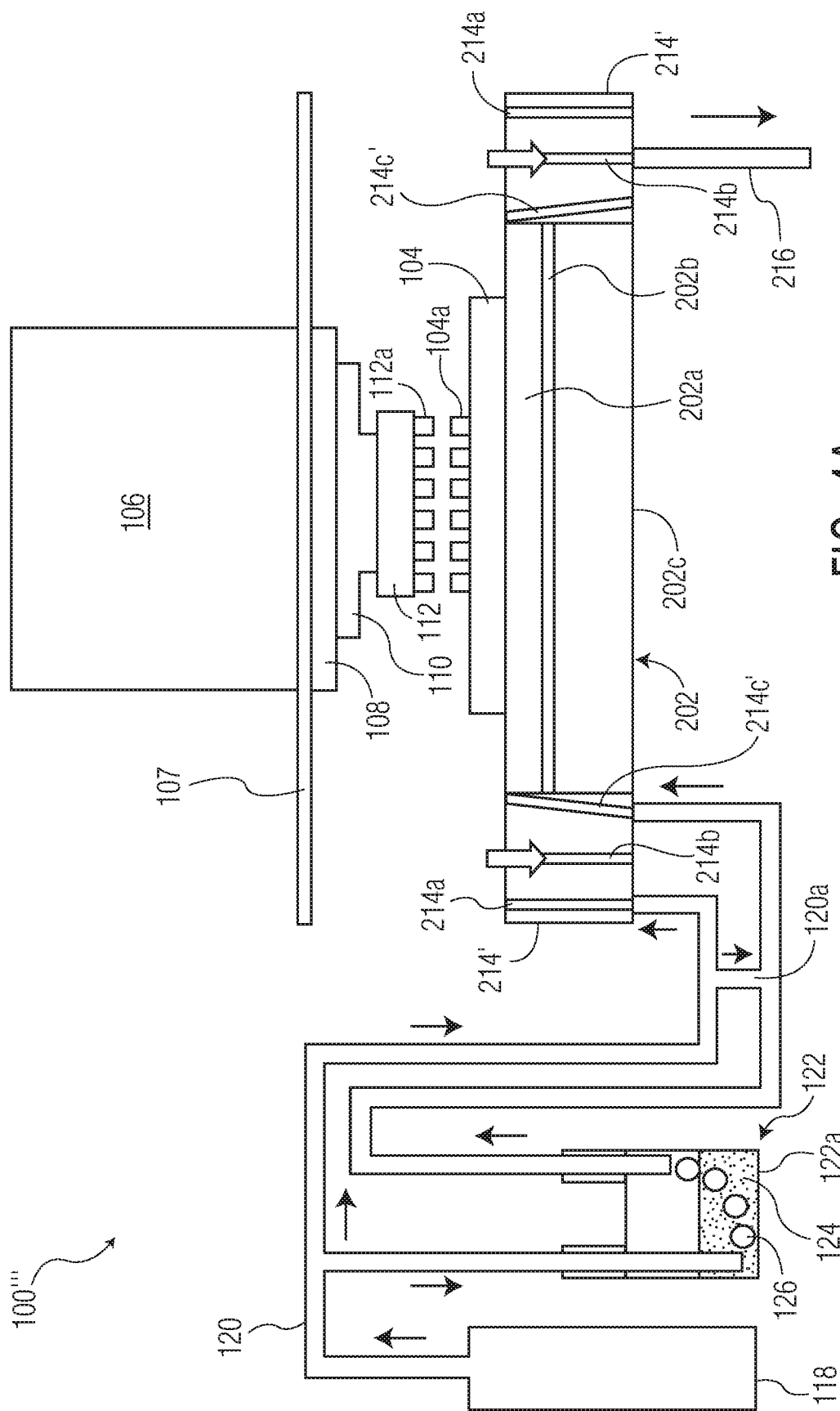
FIG. 4A is a block diagram illustration of yet another bonding machine in accordance with another exemplary embodiment of the invention.
Figure 4B:
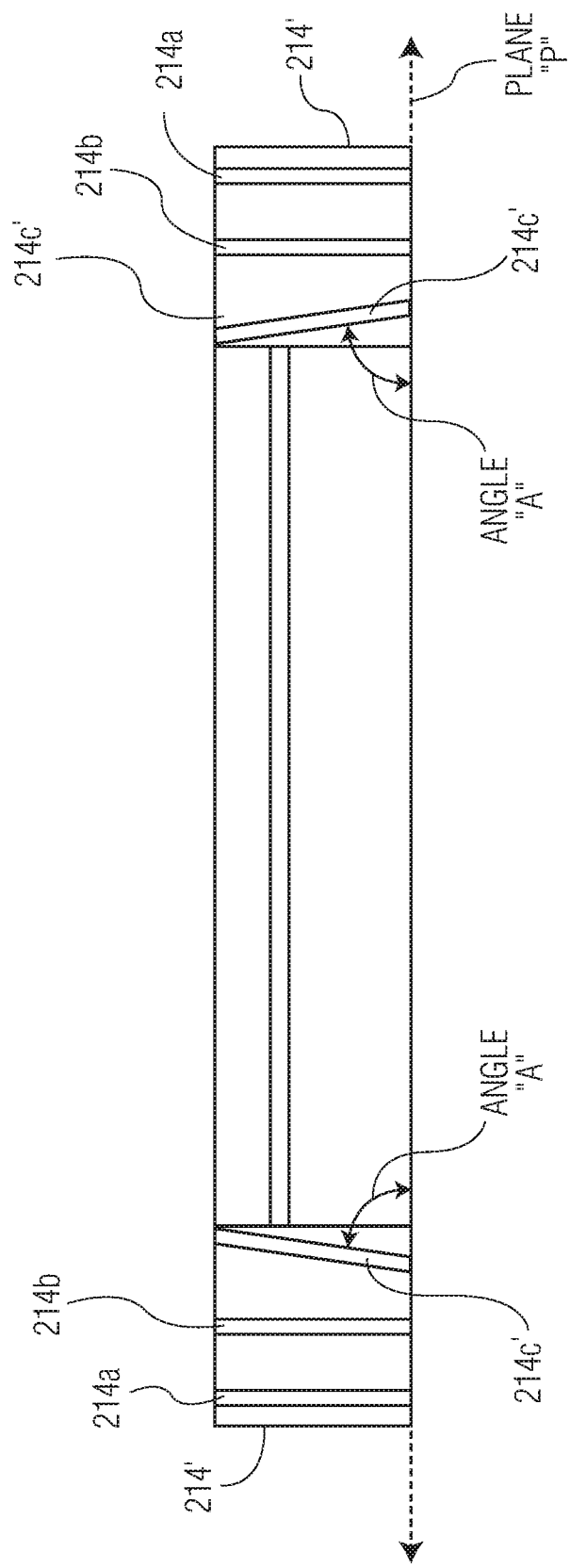
FIG. 4B is detailed view of a portion of the bonding machine of FIG. 4A.

FIGS. 4A-4B illustrate a bonding machine 100''' that is substantially similar to bonding machine 100'' (e.g., a flip chip bonding machine, a thermocompression bonding machine, etc.) illustrated and described above in connection with FIGS. 3A-3I. Nonetheless, it is understood that the process of FIGS. 3A-3I may also be performed using bonding machine 100''' of FIGS. 4A-4B. Bonding machine 100''' of FIGS. 4A-4B differs from bonding machine 100'' (of FIGS. 3A-3I) in connection with the inner channel of the manifold. More specifically, in FIGS. 4A-4B, an inner channel 214c' of manifold 214' is oriented along a non-vertical path. That is, inner channel 214c' is angled with respect to the illustrated horizontal plane "P" (see FIG. 4B). As will be appreciated by those skilled in the art, horizontal plane "P" may be oriented, for example, with respect to an x-axis and/or a y-axis of bonding machine 100'''. An exemplary range for the angle "A" shown in FIG. 4B is between 10-60 degrees. By orienting inner channel 214c' along such an angle, the reducing gas (e.g., a saturated vapor gas) may be provided more efficiently to the area of semiconductor element 112 and substrate 104.

Although the invention has been illustrated primarily with respect to one of manifolds 114, 114', 214, and 214' for directing (i) the flow of reducing gas 130, (ii) the flow of shielding gas 128, and (iii) the pull of the vacuum, it is understood that the structure used to direct the flow patterns may be different from that illustrated. That is, the configuration of the structure used to provide and direct fluids 130, 128 (and to draw vacuum) may vary considerably from that shown.

Although the invention has been illustrated and described primarily with respect to heat transfer being provided via the electrically conductive structures 112a (through heating of semiconductor element 112 using heater 108), it is understood that the heat causing the cleaning reaction of electrically conductive structures 104a may be provided by an alternative mechanism. For example, a laser source (e.g., a visible laser light source, an ultraviolet laser light source, an infrared laser light source, etc.) may be provided on the bonding machine for heating electrically conductive structures 104a.

Although the invention has been illustrated and described primarily with respect to a bond head assembly being provided to move the semiconductor element in order to separate (and re-contact) the electrically conductive structures of the semiconductor element from the electrically conductive structures of the substrate, the invention is not limited thereto. In other examples, the support structure may move the substrate in order to separate (and re-contact) the electrically conductive structures of the semiconductor element from the electrically conductive structures of the substrate. In other examples, both the bond head assembly and the support structure may move in order to separate (and re-contact) the electrically conductive structures of the semiconductor element from the electrically conductive structures of the substrate.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of bonding a semiconductor element to a substrate, the method comprising the steps of:
   (a) carrying a semiconductor element with a bonding tool of a bonding machine, the semiconductor element including a plurality of first electrically conductive structures;
   (b) supporting a substrate with a support structure of the bonding machine, the substrate including a plurality of second electrically conductive structures;
   (c) providing a reducing gas in contact with each of the plurality of first electrically conductive structures and the plurality of second electrically conductive structures;
   (d) establishing contact between corresponding ones of the plurality of first electrically conductive structures and the plurality of second electrically conductive structures after step (c);
   (e) moving at least one of the semiconductor element and the substrate after step (d) such that the corresponding ones of the plurality of first electrically conductive structures and the plurality of second electrically conductive structures are separated from one another;
   (f) re-establishing contact between the corresponding ones of the plurality of first electrically conductive structures and the plurality of second electrically conductive structures after step (e); and
   (g) bonding the corresponding ones of the plurality of first electrically conductive structures to the respective ones of the plurality of second electrically conductive structures after step (f).

2. The method of claim 1 wherein the reducing gas includes a carrier gas and an acid.

3. The method of claim 2 wherein the acid includes one of formic acid and acetic acid.

4. The method of claim 1 wherein the reducing gas is a saturated vapor gas provided via a vapor generation system included on the bonding machine.

5. The method of claim 1 wherein, during step (d), heat is transferred from ones of the plurality of first conductive structures to ones of the plurality of second conductive structures.

6. The method of claim 5 wherein the heat transferred to the ones of the plurality of second conductive structures is provided by a heater of the bonding tool carrying the semiconductor element in step (a).

7. The method of claim 1 wherein a force applied between the corresponding ones of the plurality of first conductive structures and the plurality of second conductive structures during step (d) is less than 10 N.

8. The method of claim 1 wherein a surface of each of the plurality of first electrically conductive structures and a surface of each of the plurality of second electrically conductive structures includes a reaction product from the reducing gas provided in step (c).

9. The method of claim 8 wherein the reaction product is provided as a result of (i) a surface oxide on the surface of each of the plurality of first electrically conductive structures and the surface of each of the plurality of second electrically conductive structures, and (ii) the reducing gas.

10. The method of claim 1 wherein additional reducing gas adheres to a surface of each of the plurality of first electrically conductive structures and a surface of each of the plurality of second electrically conductive structures between step (e) and step (f).

11. The method of claim 1 wherein steps (e) and (f) are repeated at least one time prior to step (g).

12. The method of claim 1 wherein steps (e) and (f) are repeated a plurality of times prior to step (g).

13. The method of claim 1 wherein step (g) includes applying ultrasonic energy between the semiconductor element and the substrate.

14. The method of claim 1 wherein step (g) includes bonding the corresponding ones of the plurality of first electrically conductive structures to the respective ones of the plurality of second electrically conductive structures through a thermocompression bonding process.

15. The method of claim 1 wherein an interface between the ones of the plurality of first electrically conductive structures and the respective ones of the plurality of second electrically conductive structures is heated during the contact established at step (d).

16. The method of claim 15 wherein the interface is heated using a heater of the bonding tool.

17. The method of claim 15 wherein the interface is heated using a heater separate from the bonding tool.

18. The method of claim 17 wherein the heater includes a laser source provided on the bonding machine.

19. The method of claim 1 wherein the bonding tool is carried by a bond head of the bonding machine, and wherein step (c) includes providing the reducing gas in contact with each of the plurality of first electrically conductive structures and the plurality of second electrically conductive structures via a manifold integrated with the bond head.

20. The method of claim 1 wherein step (c) includes providing the reducing gas in contact with each of the plurality of first electrically conductive structures and the plurality of second electrically conductive structures via a manifold integrated with the support structure.

21. A method of bonding a semiconductor element to a substrate, the method comprising the steps of:
(a) carrying a semiconductor element with a bonding tool of a bonding machine, the semiconductor element including a plurality of first electrically conductive structures;
(b) supporting a substrate with a support structure of the bonding machine, the substrate including a plurality of second electrically conductive structures;
(c) providing a reducing gas in contact with each of the plurality of first electrically conductive structures and the plurality of second electrically conductive structures, the reducing gas being provided via a manifold for directing the reducing gas to contact each of the plurality of first electrically conductive structures and the plurality of second electrically conductive structures, the manifold including a fluid channel for carrying the reducing gas to an exit portion of the manifold, the fluid channel being provided along an angle with respect to a horizontal plane of the bonding machine, the angle being between 10-60 degrees; and
(d) bonding the corresponding ones of the plurality of first electrically conductive structures to the respective ones of the plurality of second electrically conductive structures after step (c).

22. The method of claim 21 wherein the manifold is integrated with the bond head.

23. The method of claim 21 wherein the manifold is integrated with the support structure.

24. The method of claim 21 wherein, prior to step (d), the method further comprises the steps of: establishing contact between corresponding ones of the plurality of first electrically conductive structures and the plurality of second electrically conductive structures after step (c); moving at least one of the semiconductor element and the substrate after the establishing step such that the corresponding ones of the plurality of first electrically conductive structures and the plurality of second electrically conductive structures are separated from one another; and re-establishing contact between the corresponding ones of the plurality of first electrically conductive structures and the plurality of second electrically conductive structures after the moving step.

* * * * *